US008380466B2

(12) United States Patent
Nishiyama

(10) Patent No.: US 8,380,466 B2
(45) Date of Patent: Feb. 19, 2013

(54) SYSTEM IDENTIFICATION METHOD AND PROGRAM, STORAGE MEDIUM, AND SYSTEM IDENTIFICATION DEVICE

(75) Inventor: Kiyoshi Nishiyama, Morioka (JP)

(73) Assignee: Incorporated National University Iwate University, Morioka-Shi (JP)

( * ) Notice: Subject to any disclaimer, the term of this patent is extended or adjusted under 35 U.S.C. 154(b) by 790 days.

(21) Appl. No.: 12/296,647

(22) PCT Filed: Apr. 12, 2007

(86) PCT No.: PCT/JP2007/058033
§ 371 (c)(1), (2), (4) Date: Sep. 28, 2009

(87) PCT Pub. No.: WO2007/119766
PCT Pub. Date: Oct. 25, 2007

(65) Prior Publication Data
US 2010/0030529 A1 Feb. 4, 2010

(30) Foreign Application Priority Data

Apr. 14, 2006 (JP) .................................. 2006-111607

(51) Int. Cl.
*G06F 7/60* (2006.01)
*G06F 17/10* (2006.01)
(52) U.S. Cl. .......................................... 703/2; 708/300
(58) Field of Classification Search ...................... 703/2; 708/300–323
See application file for complete search history.

(56) References Cited

U.S. PATENT DOCUMENTS

| 5,394,322 A | * | 2/1995 | Hansen ........................... 700/37 |
| 5,987,444 A | * | 11/1999 | Lo .................................. 706/25 |
| 5,995,620 A | * | 11/1999 | Wigren ..................... 379/406.09 |
| 7,039,567 B2 | | 5/2006 | Nishiyama |
| 2007/0185693 A1 | | 8/2007 | Nishiyama |

FOREIGN PATENT DOCUMENTS

| JP | 61-200713 | 9/1986 |
| JP | 07-110693 | 4/1995 |
| JP | 07-185625 | 7/1995 |

(Continued)

OTHER PUBLICATIONS

"Fuzzy H∞Filter Design for a Class of Nonlinear Discrete—Time Systems With Multiple Time Delays", Zhang, et al. IEEE Transactions on Fuzzy Systems, vol. 15, No. 3, Jun. 2007.*

(Continued)

*Primary Examiner* — Kandasamy Thangavelu
*Assistant Examiner* — Nithya Janakiraman
(74) *Attorney, Agent, or Firm* — Franklin & Associates International llc; Matthew F. Lambrinos

(57) ABSTRACT

A large-scale sound system or communication system is numerically and stably identified. When an input signal is represented by the M($\leq$N)-th order AR model, high-speed $H_\infty$ filtering can be performed with a computational complex 3N+O(M). A processing section determines the initial state of a recursive equation (S201), sets $C^U_k$ according to an input $u_k$ (S205), determines a variable recursively (S207), updates a matrix $G_k^N$, calculates an auxiliary gain matrix $K^{U,N}_k$ (S209), divides it (S211), calculates a variable $D_k^M$ and a backward prediction error $\eta_{m,k}$ (S213), calculate a gain matrix $K_k$ (S215), and updates a filter equation of a high-speed $H_\infty$ filter (S217). To reduce the computational complexity, $K_k(:, 1)/(1+ &ggr;_f^{-2} H_k K_k(:, 1))$ is directly used as the filter gain $K_{s,k}$.

14 Claims, 13 Drawing Sheets

(a) FAST $H_\infty$ FILTER (b) NUMERICAL STABILIZED FAST $H_\infty$ FILTER

FOREIGN PATENT DOCUMENTS

JP    2002-135171    5/2002

OTHER PUBLICATIONS

"An H∞Optimization and Its Fast Algorithm for Time-Variant System Identification", K. Nishiyama. IEEE Transactions on Signal Processing, vol. 52, No. 5, May 2004.*

"A Nonlinear Filter for Estimating a Sinusoidal Signal and Its Parameters in White Noise: On the Case of a Single Sinusoid", K Nishiyama. IEEE Transactions on Signal Processing, vol. 45, No. 4, Apr. 1997.*

"A State-Space Approach to Adaptive RLS Filtering" by Ali H. Sayed and Thomas Kailath, IEEE Signal Processing Magazine, Jul. 1994, pp. 18-60.

"Robust Estimation of a Single Complex Sinusoid in White Noise—H Filtering Approach" by Kiyoshih Nishiyama, IEEE Transactions on Signal Processing, vol. 47, No. 10, Oct. 1999.

"H—Learning of Layered Neural Networks" by Nishiyama et al, IEEE Transactions on Nueral Networks, vol. 12, No. 6, Nov. 2001.

* cited by examiner $$\underline{C}_k^M = \check{C}_k(:, N-M+1:N), \quad C_{k-1}^M = \check{C}_k(:, 2:M+1), \quad H_k = \check{C}_k(1, 1:N).$$

(a) ESTIMATED VALUE OF IMPULSE RESPONSE ($\hat{x}_{256|256}$)

(b) CONVERGENCE CHARACTERISTIC OF TAP ERROR (a) FAST $H_\infty$ FILTER (b) NUMERICAL STABILIZED FAST $H_\infty$ FILTER

| | Mul. | Dev. |
|---|---|---|
| FHF | $26N + 13$ | $2N + 3$ |
| OR-FHF | $3N + 26M + 13$ | $5M + 5$ |

FIG. 12

| $h_0$ | $h_1$ | $h_2$ | $h_3$ | $h_4$ | $h_5$ |
|---|---|---|---|---|---|
| 0.0 | 0.008 | -0.012 | 0.064 | 0.013 | -0.052 |
| $h_6$ | $h_7$ | $h_8$ | $h_9$ | $h_{10}$ | $h_{11}$ |
| -0.007 | 0.039 | 0.011 | 0.0 | -0.002 | -0.009 |
| $h_{12}$ | $h_{13}$ | $h_{14}$ | $h_{15}$ | $h_{16}$ | $h_{17}$ |
| -0.016 | -0.013 | -0.001 | 0.004 | 0.015 | 0.013 |
| $h_{18}$ | $h_{19}$ | $h_{20}$ | $h_{21}$ | $h_{22}$ | $h_{23}$ |
| 0.007 | 0.0 | -0.001 | -0.002 | -0.001 | 0.0 |

FIG. 13

SYSTEM IDENTIFICATION METHOD AND PROGRAM, STORAGE MEDIUM, AND SYSTEM IDENTIFICATION DEVICE

TECHNICAL FIELD

The present invention relates to a system identification method and program, a storage medium, and a system identification device, and particularly to a numerically stabilized fast identification method. Besides, the present invention relates to various system identification methods such as fast identification of a large-scale sound system or communication system using characteristics of a sound as an input signal.

BACKGROUND ART

System identification means estimating a mathematical model (transfer function, impulse response, etc.) of an input/output relation of a system based on input/output data, and typical application examples include an echo canceller in international communication, an automatic equalizer in data communication, an echo canceller and sound field reproduction in a sound system, active noise control in a vehicle etc. and the like. Hitherto, as an adaptable algorithm in the system identification, LMS (Least Mean Square), RLS (Recursive Least Square), or Kalman filter is widely used. In general, an observed value of output of a system is expressed as follows:

[Mathematical Expression 1]

$$y_k = \sum_{i=0}^{N-1} h_i u_{k-i} + v_k \qquad (1)$$

Where, $u_k$ denotes an input, $h_i$ denotes an impulse response of the system, and $v_k$ is assumed to be a white noise.

The details are described in non-patent document 1 or the like.

1. LMS

In the LMS, an impulse response $x_k = [h_0, \ldots, h_{N-1}]^T$ of a system is estimated from an input $u_k$ and an output $y_k$ as follows:

[Mathematical Expression 2]

$$\hat{x}_k = \hat{x}_{k-1} + \mu H_k^T(y_k - H_k \hat{x}_{k-1}) \qquad (2)$$

Where, $H_k = [u_k, \ldots, u_{k-N+1}]^T$, $\mu > 0$.

2. RLS

In the RLS, an impulse response $x_k = [h_0, \ldots, h_{N-1}]^T$ of a system is estimated from an input $u_k$ and an output $y_k$ as follows:

[Mathematical Expression 3]

$$\hat{x}_k = \hat{x}_{k-1} + K_k(y_k - H_k \hat{x}_{k-1}) \qquad (3)$$

$$K_k = \frac{P_{k-1} H_k^T}{\rho + H_k P_{k-1} H_k^T} \qquad (4)$$

$$P_k = (P_{k-1} - K_k H_k P_{k-1})/\rho \qquad (5)$$

Where, $\hat{x}_0 = 0$, $P_0 = \epsilon_0 I$, $\epsilon_0 > 0$, 0 denotes a zero vector, I denotes a unit matrix, $K_k$ denotes a filter gain, and $\rho$ denotes a forgetting factor. (Incidentally, "^", "v" means an estimated value and should be placed directly above a character as represented by the mathematical expressions. However, it is placed at the upper right of the character for input convenience. The same applies hereinafter.)

3. Kalman Filter

A minimum variance estimate $\hat{x}_{k|k}$ of a state $x_k$ of a linear system expressed in a state space model as indicated by

[Mathematical Expression 4]

$$x_{k+1} = \rho^{-\frac{1}{2}} x_k, \; y_k = H_k x_k + v_k \qquad (6)$$

is obtained by a following Kalman filter.

[Mathematical Expression 5]

$$\hat{x}_{k|k} = \hat{x}_{k|k-1} + K_k(y_k - H_k \hat{x}_{k|k-1}) \qquad (7)$$

$$\hat{x}_{k+1|k} = \rho^{-\frac{1}{2}} \hat{x}_{k|k}$$

$$K_k = \hat{\Sigma}_{k|k-1} H_k^T (\rho + H_k \hat{\Sigma}_{k|k-1} H_k^T)^{-1} \qquad (8)$$

$$\hat{\Sigma}_{k|k} = \hat{\Sigma}_{k|k-1} - K_k H_k \hat{\Sigma}_{k|k-1}$$

$$\hat{\Sigma}_{k+1|k} = \hat{\Sigma}_{k|k} / \rho \qquad (9)$$

Where,

[Mathematical Expression 6]

$$\hat{x}_{1|0}=0, \; \hat{\Sigma}_{1|0}=\epsilon_0 I, \; \epsilon_0 > 0 \qquad (10)$$

$x_k$: a state vector or simply a state; unknown, and this is an object of estimation.
$y_k$: an observation signal; an input of the filter and known.
$H_k$: an observation matrix; known.
$v_k$: an observation noise; unknown.
$\rho$: a forgetting factor; generally determined by trial and error.
$K_k$: a filter gain; obtained from a matrix $\hat{\Sigma}_{k|k-1}$.
$\hat{\Sigma}_{k|k}$: corresponding to a covariance matrix of an error of $\hat{x}_{k|k}$; obtained by a Riccati equation.
$\hat{\Sigma}_{k+1|k}$: corresponding to a covariance matrix of an error of $\hat{x}_{k+1|k}$; obtained by a Riccati equation.
$\hat{\Sigma}_{1|0}$: corresponding to a covariance matrix of an initial state; although unknown, $\epsilon_0 I$ is used for convenience.

In addition, hitherto, there are techniques described in patent documents 1 and 2 and non-patent documents 2 to 5.

Patent document 1: WO 02/035727, JP-A-2002-135171
Patent document 2: WO 2005/015737
Non-patent document 1: S. Haykin, Adaptive Filter Theory, 3rd Edition, Prentice-Hall, 1996
Non-patent document 2: K. Nishiyama, Derivation of a Fast Algorithm of Modified H∞ Filters, Proceedings of IEEE International Conference on Industrial Electronics, Control and Instrumentation, RBC-II, pp. 462-467, 2000
Non-patent document 3: K. Nishiyama, An H∞ Optimization and Its Algorithm for Time-Variant System Identification, IEEE Transactions on Signal Processing, 52, 5, pp. 1335-1342, 2004
Non-patent document 4: B. Hassibi, A. H. Sayed, and T. Kailath, Indefinite-Quadratic Estimation and Control, 1st Editions, SIAM, 1999
Non-patent document 5: G. Glentis, K. Berberidis, and S. Theodoridis, Efficient least squares adaptive algorithms for FIR transversal filtering, IEEE Signal Processing Magazine, 16, 4, pp. 13-41, 1999

DISCLOSURE OF THE INVENTION

Problems that the Invention is to Solve

At present, an adaptive algorithm most widely used in the system identification is the LMS. The LMS has a problem that although the amount of calculation is small, convergence speed is very low. On the other hand, in the RLS or the Kalman filter, the value of the forgetting factor ρ which dominates the tracking performance must be determined by trial and error, and this is generally a very difficult work. Further, there is no means for determining whether the determined value of the forgetting factor is really an optimum value.

Besides, although $\Sigma^{\wedge}_{k|k-1}$ or $P_k$ is originally a positive-definite matrix, in the case where calculation is performed at single precision (example: 32 bit), it often becomes negative definite, and this is one of factors to make the Kalman filter or the RLS numerically unstable. Besides, since the amount of calculation is $O(N^2)$, when the dimension (tap number) of a state vector $x_k$ is large, the number of times of arithmetic operation per step is rapidly increased, and there has been a case where it is not suitable for a real-time processing.

In view of the above, the present invention has an object to provide an identification method for identifying a large-scale sound system or communication system at high speed and numerically stably. Besides, the invention has an object to derive an algorithm to greatly reduce the amount of calculation of a previously proposed fast $H_\infty$ filter by using characteristics of a sound as an input signal. Further, the invention has an object to provide a method of numerically stabilizing a fast $H_\infty$ filter by using a backward prediction error.

Means for Solving the Problems

According to one aspect, there is provided system identification device, for a communication system or a sound system, for performing real-time identification of a time invariable or time variable system, comprising:

a filter, including a processing section, that is robust against a disturbance by determining that a maximum energy gain to a filter error from the disturbance, as an evaluation criterion, is restricted to be smaller than a predetermined upper limit $\gamma_f^2$, wherein, the filter satisfies an $H_\infty$ evaluation criterion as indicated by following expression (14) with respect to a state space model as indicated by following expressions (11) to (13), when an input signal is expressed by an $M(\leq N)$-th order autoregressive model (AR model), the filter is given by following expressions (38) to (44), and the filter satisfies a scalar existence condition of following expressions (45) and (46):

$$x_{k+1} = x_k + G_k w_k, \; w_k, x_k \in \mathcal{R}^N \tag{11}$$

$$y_k = H_k x_k + v_k, \; y_k, v_k \in \mathcal{R} \tag{12}$$

$$z_k = H_k x_k, \; z_k \in \mathcal{R}, \; H_k \in \mathcal{R}^{1 \times N} \tag{13}$$

$$\sup_{x_0, \{w_i\}, \{v_i\}} \frac{\sum_{i=0}^{k} \|e_{f,i}\|^2 / \rho}{\|x_0 - \check{x}_0\|_{\Sigma_0^{-1}}^2 + \sum_{i=0}^{k} \|w_i\|^2 + \sum_{i=0}^{k} \|v_i\|^2 / \rho} < \gamma_f^2 \tag{14}$$

$$\hat{x}_{k|k} = \hat{x}_{k-1|k-1} + K_{s,k}(y_k - H_k \hat{x}_{k-1|k-1}) \tag{38}$$

$$K_{s,k} = \frac{K_k(:,1)}{1 + \gamma_f^{-2} H_k K_k(:,1)} \in \mathcal{R}^{N \times 1}$$

$$K_k = m_k - D_k \mu_k, \; D_k = \begin{bmatrix} 0_{N-M} \\ D_k^M \end{bmatrix} \tag{39}$$

$$D_k^M = \frac{D_{k-1}^M - m_k(N-M+1:N,:) W \eta_{M,k}}{1 - \mu_k W \eta_{M,k}}$$

$$\eta_{M,k} = c_{k-N} + \underline{C}_k^M D_{k-1}^M \tag{40}$$

$$\begin{bmatrix} m_k \\ \mu_k \end{bmatrix} = \tilde{K}_k^N, \; m_k \in \mathcal{R}^{N \times 2}, \; \mu_k \in \mathcal{R}^{1 \times 2} \tag{41}$$

$$\tilde{K}_k^N = \begin{bmatrix} 0_{(N-M+1) \times 2} \\ \tilde{M}^{-1} \\ K_{k-N+M-1} \end{bmatrix} + G_k^N, \; \tilde{K}_{k-N+M-1}^{M-1} = K_{k-N+M-1}(1:M,:) \tag{42}$$

$$S_{M,k} = \rho S_{M,k-1} + e_{M,k}^T W \tilde{e}_{M,k}, \; e_{M,k} = c_k + C_{k-1}^M A_k^M$$

$$A_k^M = A_{k-1}^M - K_{k-1}(1:M,:) W \tilde{e}_{M,k}, \; \tilde{e}_{M,k} = c_k + C_{k-1}^M A_{k-1}^M \tag{43}$$

$G_k^N$ is updatable as follows:

$$\begin{bmatrix} G_k^N \\ 0_{1 \times 2} \end{bmatrix} = \begin{bmatrix} 0_{1 \times 2} \\ G_{k-1}^N \end{bmatrix} + \begin{bmatrix} e_{M,k}^T / S_{M,k} \\ A_k^M e_{M,k}^T / S_{M,k} \\ 0_{(N-M+1) \times 2} \end{bmatrix} - \begin{bmatrix} 0_{(N-M+1) \times 2} \\ e_{M,k-N+M-1}^T / S_{M,k-N+M-1} \\ A_{k-N+M-1}^M e_{M,k-N+M-1}^T / S_{M,k-N+M-1} \end{bmatrix} \tag{44}$$

where, $\underline{C}_k^M = C_k(:, N-M+1:N)$, $C_{k-1}^M = C_{k-1}(:, 1:M), \; C_k = \begin{bmatrix} H_k \\ H_k \end{bmatrix}, \; W = \begin{bmatrix} 1 & 0 \\ 0 & -\gamma_f^{-2} \end{bmatrix}$ $e_{f,i} = z^v_{i|i} - H_i x_i, \; z^v_{i|i} = H_i \hat{x}_{i|i}$
($c_k \in \mathcal{R}^{2 \times 1}$ is a first column vector of $C_k = [c_k, \ldots, c_{k-N+1}]$, $c_{k-i} = 0_{2 \times 1}$ and $k-i < 0$ are assumed, and initial values are set to be $K_0 = 0_{N \times 2}, \; G_0^N = 0_{(N+1) \times 2}, \; A_0^M = 0_{M \times 1}, \; S_{M,0} = 1/\epsilon_0, \; D_0^M = 0_{M \times 1}, \; \hat{x}_{0|0} = \check{x}^v 0 = 0_{N \times 1}, \; 0_{m \times n}$ denotes an m×n zero matrix)

$$-\varrho \hat{\Xi}_i + \rho \gamma_f^2 > 0, \; i = 0, \ldots, k \tag{45}$$

$\varrho, \hat{\Xi}_i$ are respectively defined by following expressions:

$$\varrho = 1 - \gamma_f^2, \; \hat{\Xi}_i = \frac{\rho H_i K_{s,i}}{1 - H_i K_{s,i}} = \frac{\rho H_i K_i(:,1)}{1 - (1 - \gamma_f^{-2}) H_i K_i(:,1)} \tag{46}$$

where, for the communication system or the sound system,
$x_k$ is defined as an unknown estimated state vector or a state
$x_0$ is defined as an unknown initial state
$w_k$ is defined as an unknown system noise,
$v_k$ is defined as an unknown observation noise,
$y_{ak}$ is defined as an observation signal and a known input of the filter,
$z_k$ is defined as an unknown output signal,
$G_k$ is defined as a drive matrix and becomes known at execution, $H_z$ is defined as a known observation matrix, $\hat{x}_{k|k}$ is defined as an estimated value of the state $x_k$ at a time k using observation signals $y_0$-$y_k$ and is given by a filter equation, $K_{s,k}$ is defined as a filter gain and is obtained from a gain matrix $K_k$, $\rho$ is defined as a forgetting factor and when $\gamma_f$ is determined, is automatically determined by $\rho=1-\chi(\gamma_f)$, $\Sigma_0^{-1}$ is defined as a known inverse matrix of a weighting matrix expressing uncertainty of a state, N is defined as a predetermined dimension (tap number) of a state vector, M is defined as a predetermined order of an AR model, $\mu_k$ is defined as N+1th row vector of $K_k^{U,N}$; obtained from $K_k^{U,N}$, $m_k$ is defined as N×2 matrix including a first to an N-th row of $K_k^{U,N}$; obtained from $K_k^{U,N}$, $\gamma_f$ is defined as an attenuation level and is given at design time, $D_k^M$ is defined as a backward prediction coefficient vector and is obtained from $m_k$, $\eta_{M,k}$ and $\mu_k$, W is defined as a weighting matrix and is determined from $\gamma_f$, $A_m$ is defined as a forward prediction coefficient vector and is obtained from $K_{k-1}$ and $e_{M,k}$, $C_a^m$ is defined as a 2×M matrix including a 1st to an M-th column vector of $C_k$ and is determined from the observation matrix $H_k$, $C_k^M$ is defined as a 2×M matrix including an N−M+1-th to an N-th column vector of $C_k$ and is determined from the observation matrix $H_k$, $K_k^{U,N}$ is defined as the auxiliary gain matrix, and $\eta_{Make}$ is defined as a backward prediction error.

According to another aspect, there is provided a method of system identification using a system identification device for a communication system or a sound system, for performing real-time identification of a time invariable or time variable system, the method comprising:

providing characteristics of sound as an input signal for a system identification device;

providing the system identification device comprising a filter, including a processing section, that is robust against a disturbance by determining that a maximum energy gain to a filter error from the disturbance, as an evaluation criterion, is restricted to be smaller than a predetermined upper limit $\gamma_f^2$, wherein, the filter satisfies an $H_\infty$ evaluation criterion as indicated by following expression (14) with respect to a state space model as indicated by following expressions (11) to (13), when an input signal is expressed by an M($\leq$N)-th order autoregressive model (AR model), the filter is given by following expressions (38) to (44), and the filter satisfies a scalar existence condition of following expressions (45) and (46):

$$x_{k+1} = x_k + G_k w_k, \ w_k, x_k \in \mathcal{R}^N \quad (11)$$

$$y_k = H_k x_k + v_k, \ y_k, v_k \in \mathcal{R} \quad (12)$$

$$z_k = H_k x_k, \ z_k \in \mathcal{R}, \ H_k \in \mathcal{R}^{1 \times N} \quad (13)$$

$$\sup_{x_0,\{w_i\},\{v_i\}} \frac{\sum_{i=0}^{k} \|e_{f,i}\|^2/\rho}{\|x_0 - \check{x}_0\|_{\Sigma_0^{-1}}^2 + \sum_{i=0}^{k} \|w_i\|^2 + \sum_{i=0}^{k} \|v_i\|^2/\rho} < \gamma_f^2 \quad (14)$$

$$\hat{x}_{k|k} = \hat{x}_{k-1|k-1} + K_{s,k}(y_k - H_k \hat{x}_{k-1|k-1}) \quad (38)$$

$$K_{s,k} = \frac{K_k(:,1)}{1 + \gamma_f^{-2} H_k K_k(:,1)} \in \mathcal{R}^{N \times 1}$$

$$K_k = m_k - D_k \mu_k, \ D_k = \begin{bmatrix} 0_{N-M} \\ D_k^M \end{bmatrix} \quad (39)$$

$$D_k^M = \frac{D_{k-1}^M - m_k(N-M+1:N,:)W\eta_{M,k}}{1 - \mu_k W \eta_{M,k}}$$

$$\eta_{M,k} = c_{k-N} + \underline{C}_k^M D_{k-1}^M \quad (40)$$

$$\begin{bmatrix} m_k \\ \mu_k \end{bmatrix} = \tilde{K}_k^N, \ m_k \in \mathcal{R}^{N \times 2}, \ \mu_k \in \mathcal{R}^{1 \times 2} \quad (41)$$

$$\tilde{K}_k^N = \begin{bmatrix} 0_{(N-M+1) \times 2} \\ \tilde{K}_{k-N+M-1}^{M-1} \end{bmatrix} + G_k^N, \ \tilde{K}_{k-N+M-1}^{M-1} = K_{k-N+M-1}(1:M,:) \quad (42)$$

$$S_{M,k} = \rho S_{M,k-1} + e_{M,k}^T W \tilde{e}_{M,k}, \ e_{M,k} = c_k + C_{k-1}^M A_k^M$$

$$A_k^M = A_{k-1}^M - K_{k-1}(1:M,:)W\tilde{e}_{M,k}, \ \tilde{e}_{M,k} = c_k + C_{k-1}^M A_{k-1}^M \quad (43)$$

wherein $G_k^N$ is updated as follows:

$$\begin{bmatrix} G_k^N \\ 0_{1 \times 2} \end{bmatrix} = \begin{bmatrix} 0_{1 \times 2} \\ G_{k-1}^N \end{bmatrix} + \begin{bmatrix} e_{M,k}^T/S_{M,k} \\ A_k^M e_{M,k}^T/S_{M,k} \\ 0_{(N-M+1) \times 2} \end{bmatrix} - \begin{bmatrix} 0_{(N-M+1) \times 2} \\ e_{M,k-N+M-1}^T/S_{M,k-N+M-1} \\ A_{k-N+M-1}^M e_{M,k-N+M-1}^T/S_{M,k-N+M-1} \end{bmatrix} \quad (44)$$

where, $$\underline{C}_k^M = C_k(:,N-M+1:N),$$

$$C_{k-1}^M = C_{k-1}(:,1:M), \ C_k = \begin{bmatrix} H_k \\ H_k \end{bmatrix},$$

$$W = \begin{bmatrix} 1 & 0 \\ 0 & -\gamma_f^{-2} \end{bmatrix}$$

$e_{f,i} = z^v_{i|i} - H_i x_i, \ z^v_{i|i} = H_i \hat{x}_{i|i}$ ($C_k \in \mathcal{R}^{2 \times 1}$ is a first column vector of $C_k = [c_k, \ldots, c_{k-N+1}]$, $c_{k-1} = 0_{2 \times 1}$ and k−i<0 are assumed, and initial values are set to be $K_0 = 0_{N \times 2}$, $G_0^N = 0_{(N+1) \times 2}$, $A_0^M = 0_{M \times 1}$, $S_{M,0} = 1/\epsilon_0$, $D_0^M = 0_{M \times 1}$, $\hat{x}_{0|0} = \check{x}^v_0 = 0_{N \times 1}$, here, $0_{m \times n}$ denotes an m×n zero matrix)

$$\underline{C}_k^M = C_k(:,N-M+1:N), \ C_{k-1}^M = C_{k-1}(:,1:M),$$

$$C_k = \begin{bmatrix} H_k \\ H_k \end{bmatrix}, \ W = \begin{bmatrix} 1 & 0 \\ 0 & -\gamma_f^{-2} \end{bmatrix}$$

here, $\varrho$, $\hat{\Xi}_i$ are respectively defined by following expressions:

$$\varrho = 1 - \gamma_f^2, \ \hat{\Xi}_i = \frac{\rho H_i K_{s,i}}{1 - H_i K_{s,i}} = \frac{\rho H_i K_i(:,1)}{1 - (1 - \gamma_f^{-2}) H_i K_i(:,1)} \quad (46)$$

where, for the communication system or the sound system, $x_k$ is defined as an unknown estimated state vector a state, $x_0$ is defined as an unknown initial state, $w_k$ is defined as an unknown system noise,
$v_k$ is defined as an observation noise,
$y_k$ is defined as an observation signal and a known input of the filter,
$z_k$ is defined as an unknown output signal,
$G_k$ is defined as a drive matrix and becomes known at execution,
$H_k$ is defined as a known observation matrix,
$\hat{x}_{k|k}$ is defined as an estimated value of the state $x_k$ at a time k using observation signals $y_0 - y_k$ and is given by a filter equation,
$K_{s,k}$ is defined as a filter gain and is obtained from a gain matrix $K_k$,
$\rho$ is defined as a forgetting factor and, when $\gamma_f$ is determined, is automatically determined by $\rho = 1 - \chi(\gamma_f)$,
$\Sigma_0^{-1}$ is defined as a known inverse matrix of a weighting matrix expressing uncertainty of a state,
N is defined as a predetermined dimension (tap number) of a state vector,
M is defined as a predetermined order of an AR model
$\mu_k$ is defined as N+1th row vector of $K^{U\,N}_k$; obtained from $K^{U\,N}_k$,
$m_k$ is defined as N×2 matrix including a first to an N-th row of $K^{U\,N}_k$; obtained from $K^{U\,N}_k$,
$\gamma_f$ is defined as an attenuation level and is given at design time,
$D_k^M$ is defined as a backward prediction coefficient vector and is obtained from $m_k$, $\eta_{M,k}$ and $\mu_k$,
W is defined as a weighting matrix and is determined from $\gamma_f$,
$A_k^M$ is defined as a forward prediction coefficient vector and is obtained from $K_{k-1}$ and $e_{M,k}$,
$C_k^M$ is defined as a 2×M matrix including a 1st to an M-th column vector of $C_k$ and is determined from the observation matrix $H_k$,
$\bar{C}_k^M$ is defined as a 2×M matrix including an N−M+1-th to an N-th column vector of $C_k$ and is determined from the observation matrix $H_k$,
$K^{U\,N}_k$ is defined as the auxiliary gain matrix, and
$\eta_{M,k}$ is defined as a backward prediction error;
the method further comprising
by using a processing section of the filter of the system identification device, performing for the communication system or the sound system real-time identification of the time variable or time variable system based on the input signal.

According to one or more aspects, it is possible to provide an identification method for identifying a large-scale sound system or communication system at high speed and numerically stably. Besides, according to one or more aspects of the present invention, it is possible to derive an algorithm to greatly reduce the amount of calculation of a previously proposed fast $H_\infty$ filter by using characteristics of a sound as an input signal. Further, according to one or more aspects of the present invention, it is possible to provide a method of numerically stabilizing a fast $H_\infty$ filter by using a backward prediction error.

BRIEF DESCRIPTION OF THE DRAWINGS

FIG. 12 A view of a result of comparison between the amount of calculation of a fast $H_\infty$ filter and that of the order-recursive fast $H_\infty$ filter.
FIG. 13 A view showing an impulse response of an echo path.

BEST MODE FOR CARRYING OUT THE INVENTION

1. Explanation of Symbols

First, main symbols used in the embodiment will be described.
$x_k$: a state vector or simply a state; unknown, this is an object of estimation,
$x_0$: an initial state; unknown,
$w_k$: a system noise; unknown,
$v_k$: an observation noise; unknown,
$y_k$: an observation signal; input of the filter and known,
$z_k$: an output signal, unknown,
$G_k$: a drive matrix; becomes known at execution,
$H_k$: an observation matrix; known,
$\hat{x}_{k|k}$: an estimated value of the state $x_k$ at a time k using observation signals $y_0 - y_k$; given by a filter equation,
$K_{s,k}$: a filter gain; obtained from a gain matrix $K_k$,
$\rho$: a forgetting factor; in a case of Theorem 1-Theorem 3, when $\gamma_f$ is determined, it is automatically determined by $\rho = 1 - \chi(\gamma_f)$,
$\Sigma_0^{-1}$: an inverse matrix of a weighting matrix expressing uncertainty of a state; $\Sigma_0$ is known,
N: a dimension (tap number) of a state vector; previously given,
M: an order of an AR model; previously given,
$\mu_k$: N+1th row vector of $K^{U\,N}_k$; obtained from $K^{U\,N}_k$,
$m_k$: N×2 matrix including a first to an N-th row of $K^{U\,N}_k$; obtained from $K^{U\,N}_k$,
$\gamma_f$: attenuation level; given at design time
$D_k^M$: a backward prediction coefficient vector; obtained from $m_k$, $\mu_{M,k}$ and $\mu_k$,
W: a weighting matrix; determined from $\gamma_f$,
$A_k^M$: a forward prediction coefficient vector; obtained from $K_{k-1}$ and $e_{M,k}$,
$C_k^M$: a 2×M matrix including a 1st to an M-th column vector of $C_k$; determined from the observation matrix $H_k$, and
$\bar{C}_k^M$: a 2×M matrix including an N−M+1-th to an N-th column vector of $C_k$; determined from the observation matrix $H_k$.

Incidentally, "^", "v" placed above the symbol mean estimated values. Besides, "~", "−", "U" and the like are symbols added for convenience. Although these symbols are placed at the upper right of characters for input convenience, as indicated in mathematical expressions, they are the same as those placed directly above the characters. Besides, x, w, H, G, K, R, Σ and the like are matrixes and should be expressed by thick letters as indicated in the mathematical expressions, however, they are expressed in normal letters for input convenience.

2. Hardware of System Estimation and Program

A system estimation method or a system estimation device/system can be provided by a system estimation program to cause a computer to execute respective procedures, a computer readable recording medium recording the system estimation program, a program product including the system estimation program and capable of being loaded in an internal memory of a computer, a computer, such as a server, including the program, and the like.

Figure 11:
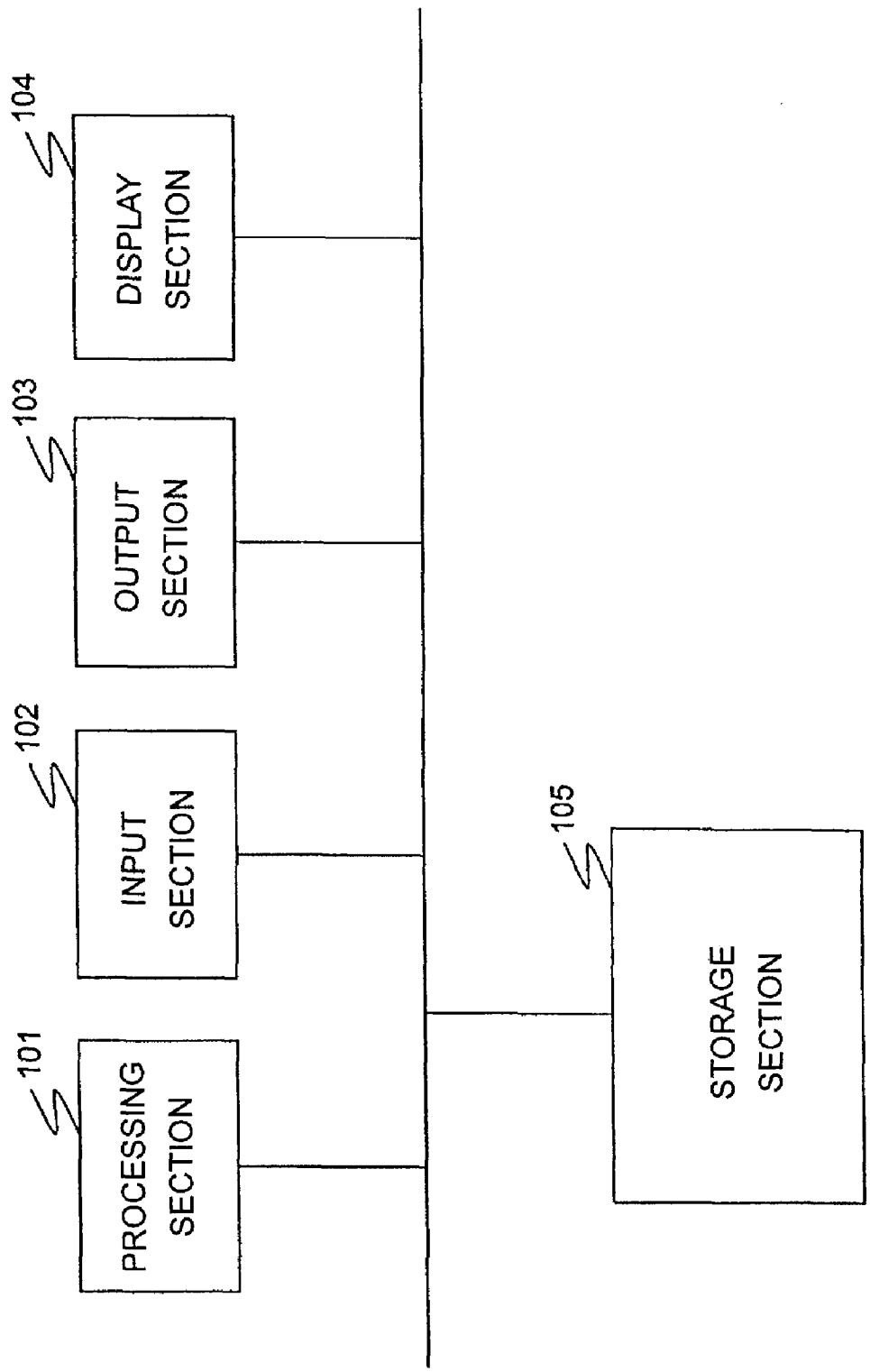
FIG. 11 A structural view of hardware of an embodiment.

FIG. 11 is a structural view of hardware of this embodiment.

The hardware includes a processing section 101 as a central processing unit (CPU), an input section 102, an output section 103, a display section 104, and a storage section 105. Besides, the processing section 101, the input section 102, the output section 103, the display section 104, and the storage section 105 are connected through suitable connection means such as a star or a bus. The known data described in "1. Explanation of Symbols" and subjected to the system estimation are stored in the storage section 105 as the need arises. Besides, the unknown and known data, calculated data relating to the hyper $H_\infty$ filter, and the other data are written and/or read by the processing section 101 as the need arises.

3. Means of an Identification Method Relevant to the Embodiment

In order to differentiate from a normal $H_\infty$ filter, an $H_\infty$ filter in which a forgetting factor can be optimally (quasi-optimally) determined in the meaning of $H_\infty$ is especially called a hyper $H_\infty$ filter (non-patent document 2, non-patent document 3). The $H_\infty$ filter has a feature that it can be applied even when the dynamics of a state is unknown.

Theorem 1 (Hyper $H_\infty$ Filter)

With respect to a state space model

[Mathematical Expression 13]

$$x_{k+1} = x_k + G_k w_k,\ w_k,\ x_k \in R^N \tag{11}$$

$$y_k = H_k x_k + v_k,\ y_k,\ v_k \in R \tag{12}$$

$$z_k = H_k x_k,\ z_k \in R,\ H_k \in R^{1 \times N} \tag{13}$$

a state estimated value $\hat{x}_{k|k}$ (or an output estimated value $\hat{z}^v_{k|k}$) satisfying $$\sup_{x_0,\{w_i\},\{v_i\}} \frac{\sum_{i=0}^{k} \|e_{f,i}\|^2 / \rho}{\|x_0 - \check{x}_0\|^2_{\Sigma_0^{-1}} + \sum_{i=0}^{k} \|w_i\|^2 + \sum_{i=0}^{k} \|v_i\|^2 / \rho} < \gamma_f^2 \tag{14}$$

is given by a following hyper $H_\infty$ filter of level $\gamma_f$.

[Mathematical Expression 14]

$$\hat{z}_{k|k} = H_k \hat{x}_{k|k} \tag{15}$$

$$\hat{x}_{k|k} = \hat{x}_{k-1|k-1} + K_{s,k}(y_k - H_k \hat{x}_{k-1|k-1}) \tag{16}$$

$$K_{s,k} = \hat{\Sigma}_{k|k-1} H_k^T (H_k \hat{\Sigma}_{k|k-1} H_k^T + \rho)^{-1} \tag{17}$$

$$\hat{\Sigma}_{k|k} = \hat{\Sigma}_{k|k-1} - \hat{\Sigma}_{k|k-1} C_k^T R_{e,k}^{-1} C_k \hat{\Sigma}_{k|k-1}\ \hat{\Sigma}_{k+1|k} = \hat{\Sigma}_{k|k}/\rho \tag{18}$$

where, $$e_{f,i} = \check{z}_{i|i} - H_i x_i,\ \hat{x}_{0|0} \check{x}_0,\ \hat{\Sigma}_{1|0} = \Sigma_0 \tag{19}$$

$$R_{e,k} = R + C_k \hat{\Sigma}_{k|k-1} C_k^T$$

$$R = \begin{bmatrix} \rho & 0 \\ 0 & -\rho \gamma_f^2 \end{bmatrix},\ C_k = \begin{bmatrix} H_k \\ H_k \end{bmatrix}$$

$$0 < \rho = 1 - \chi(\gamma_f) \le 1,\ \gamma_f > 1 \tag{20}$$

$\chi(\gamma_f)$ is a monotonically decreasing function satisfying $\chi(1)=1$ and $\chi(\infty)=0$. Besides, a drive matrix $G_k$ is generated as follows:

[Mathematical Expression 15]

$$G_k G_k^T = \chi(\gamma_f) \hat{\Sigma}_{k+1|k} = \frac{\chi(\gamma_f)}{\rho} \hat{\Sigma}_{k|k} \tag{21}$$

Where, a following existence condition must be satisfied.

[Mathematical Expression 16]

$$\hat{\Sigma}_{i|i}^{-1} = \hat{\Sigma}_{i|i-1}^{-1} + \frac{1 - \gamma_f^{-2}}{\rho} H_i^T H_i > 0,\ i = 0, \ldots, k \tag{22}$$

The feature of the hyper $H_\infty$ filter is that the generation of robustness in the state estimation and the optimization of the forgetting factor $\rho$ are simultaneously performed.

When the hyper $H_\infty$ filter satisfies the existence condition, the in equation of expression (14) is always satisfied. Thus, in the case where the disturbance energy of the denominator of expression (14) is limited, the total sum of the square estimated error of the numerator becomes bounded, and the estimated error after a certain time has to become 0. This means that when $\gamma_f$ can be made small, the estimated value $\hat{x}_{k|k}$ can more quickly follow the change of the state $x_k$.

Here, attention should be given to the fact that the algorithm of the hyper $H_\infty$ filter of Theorem 1 is different from that of the normal $H_\infty$ filter (non-patent document 4). Besides, when $\gamma_f \to \infty$, then $\rho=1$ and $G_k=0$, and the algorithm of the hyper $H_\infty$ filter of Theorem 1 formally coincides with the algorithm of the Kalman filter.

The amount of calculation of the hyper $H_\infty$ filter is $O(N^2)$, and this is not suitable for a real-time processing. However, when an observation matrix $H_k$ has a shift characteristic $H_{k+1}=[u_{k+1}, H_k(1), H_k(2), \ldots, H_k(N-1)]$, a fast algorithm of the amount of calculation $O(N)$ has been developed (non-patent document 2, non-patent document 3).

Theorem 2 (Fast $H_\infty$ Filter)

When the observation matrix $H_k$ satisfies the shift characteristic, the hyper $H_\infty$ filter having $\Sigma_0 = \epsilon_0 I > 0$ can be executed by a following expression and with the amount of calculation $O(N)$.

[Mathematical Expression 17]

$$\hat{x}_{k|k} = \hat{x}_{k-1|k-1} + K_{s,k}(y_k - H_k \hat{x}_{k-1|k-1}) \tag{23}$$

$$K_{s,k} = \frac{K_k(:,1)}{1 + \gamma_f^{-2} H_k K_k(:,1)} \in \mathcal{R}^{N \times 1} \tag{24}$$

-continued $$K_k = m_k - D_k\mu_k \in \mathcal{R}^{N\times 2} \quad (25)$$
$$D_k = [D_{k-1} - m_k W\eta_k][1 - \mu_k W\eta_k]^{-1}$$

$$\eta_k = c_{k-N} + C_k D_{k-1} \quad (26)$$

$$\begin{bmatrix} m_k \\ \mu_k \end{bmatrix} = \check{K}_k, \; m_k \in \mathcal{R}^{N\times 2}, \; \mu_k \in \mathcal{R}^{1\times 2} \quad (27)$$

$$\check{K}_k = \begin{bmatrix} S_k^{-1} e_k^T \\ K_{k-1} + A_k S_k^{-1} e_k^T \end{bmatrix} \quad (28)$$

$$S_k = \rho S_{k-1} + e_k^T W \tilde{e}_k, \; e_k = c_k + C_{k-1}A_k$$

$$A_k = A_{k-1} - K_{k-1} W \tilde{e}_k, \; \tilde{e}_k = c_k + C_{k-1}A_{k-1} \quad (29)$$
Where,
$$C_k = \begin{bmatrix} H_k \\ H_k \end{bmatrix}, \; W = \begin{bmatrix} 1 & 0 \\ 0 & -\gamma_f^{-2} \end{bmatrix}$$

$C_k \in R^{2\times 1}$ is a first column vector of $C_k = [C_k, \ldots, C_{k-N+1}]$, $C_{k-i} = 0_{2\times 1}$ and $k-i<0$ are assumed, and initial values are set to be $k_0 = O_{N\times 2}$, $A_0 = O_{N\times 1}$, $S_0 = 1/\epsilon_0$, $D_0 = O_{N\times 1}$, and $\hat{X}_{0|0} = 0_{N\times 1}$. Where, $O_{m\times n}$ denotes an m×n zero matrix.

At this time, a following scalar existence condition must be satisfied.

[Mathematical Expression 18]

$$-\varrho\hat{\Xi}_i + \rho\gamma_f^2 > 0, \; i = 0, \ldots, k \quad (30)$$

Where, $\varrho$, $\hat{\Xi}_i$ are respectively defined by following expressions.

$$\varrho = 1 - \gamma_f^2, \; \hat{\Xi}_i = \frac{\rho H_i K_{s,i}}{1 - H_i K_{s,i}} = \frac{\rho H_i K_i(:,1)}{1-(1-\gamma_f^2)H_i K_i(:,1)} \quad (31)$$

4. Means of the Identification Method of the Embodiment of the Invention

4.1 Preparation

It is assumed that an input signal is expressed by an M(≦N)-th order AR model (autoregressive model), and a method of optimally generating an (N+1)×2 auxiliary gain matrix $K^U{}_k^N = Q^U{}_k^{-1} C^U{}_k^T$ from an M×2 gain matrix is derived. Where, $Q^U{}_k$ is expressed by

[Mathematical Expression 19]

$$\check{Q}_k = \rho\check{Q}_{k-1} + \check{C}_k^T W \check{C}_k \quad (32)$$

and $C^U{}_k = [C_k c_{k-N}] = [c_k C_{k-1}]$ is established (non-patent document 2).

[Lemma 1]

When an input signal is expressed by the M(≦N)-th order AR model, the auxiliary gain matrix $K^U{}_k^N$ is given by a following expression.

[Mathematical Expression 20]

$$\tilde{K}_k^N = \begin{bmatrix} 0_{(N-M+1)\times 2} \\ \tilde{K}_{k-N+M-1}^{M-1} \end{bmatrix} + \sum_{i=0}^{N-M} \frac{1}{S_{M,k-i}} \begin{bmatrix} 0_{i\times 2} \\ e_{M,k-i}^T \\ A_{k-i}^M e_{M,k-i}^T \\ 0_{(N-M-i)\times 2} \end{bmatrix} \quad (33)$$

Where, $e_{M,k} = C_K + C_{k-1}^M A_k^M$, $C_{k-1}^M = C_{k-1}(:,1:M)$, $K^U{}_{k-N+M-1}^{M-1} = K_{k-N+M-1}(1:M,:)$. Here, $C_{K-1}(:,1:M)$ denotes a matrix including the first column to the M-th column of $C_{k-1}$.

(Proof) See "7. Proof of lemma" (described later).

[Lemma 2]

When an input signal is expressed by the M(≦N)-th order AR model, the auxiliary gain matrix $K^U{}_k^N$ is equivalent to a following expression.

[Mathematical Expression 21]

$$\tilde{K}_k^N = \begin{bmatrix} 0_{(N-M+1)\times 2} \\ \tilde{K}_{k-N+M-1}^{M-1} \end{bmatrix} + G_k^N \quad (34)$$

Where, $$\begin{bmatrix} G_k^N \\ 0_{1\times 2} \end{bmatrix} = \begin{bmatrix} 0_{1\times 2} \\ G_{k-1}^N \end{bmatrix} + \frac{1}{S_{M,k}}\begin{bmatrix} e_{M,k}^T \\ A_k^M e_{M,k}^T \\ 0_{(N-M+1)\times 2} \end{bmatrix} - \quad (35)$$

$$\frac{1}{S_{M,k-N+M-1}}\begin{bmatrix} 0_{(N-M+1)\times 2} \\ e_{M,k-N+M-1}^T \\ A_{k-N+M-1}^M e_{M,k-N+M-1}^T \end{bmatrix}$$

$G_0 = O_{(N+1)\times 2}$, $K^U{}_{k-N+M-1} = O_{(M+1)\times 2}$, $k-N+M-1\leq 0$.
(Proof) See "7. Proof of lemma" (described later)

[Lemma 3]

When an input signal is expressed by the M(≦N)-th order AR model, a gain matrix $K_k$ is expressed by a following expression.

[Mathematical Expression 22]

$$K_k = m_k - D_k\mu_k \quad (36)$$
Where, $$D_k = \begin{bmatrix} 0_{N-M} \\ D_k^M \end{bmatrix}, \; D_k^M = \frac{D_{k-1}^M - m_k(N-M+1:N,:)W\eta_{M,k}}{1 - \mu_k W\eta_{M,k}}$$

$$\eta_{M,k} = c_{k-N} + \underline{C}_k^M D_{k-1}^M$$

$$\begin{bmatrix} m_k \\ \mu_k \end{bmatrix} = \tilde{K}_k^N, \; m_k \in \mathcal{R}^{N\times 2}, \; \mu_k \in \mathcal{R}^{1\times 2}$$

$$\underline{C}_k^M = C_k(:, N-M+1:N) \quad (37)$$

Here, $m_k(M:N,:) = [m_k(M,:)^T, \ldots m_k(N,:)^T]^T$, and $m_k(i,:)$ is the i-th row vector of $m_k$.
(Proof) See "7. Proof of lemma" (described later)

Figure 1:
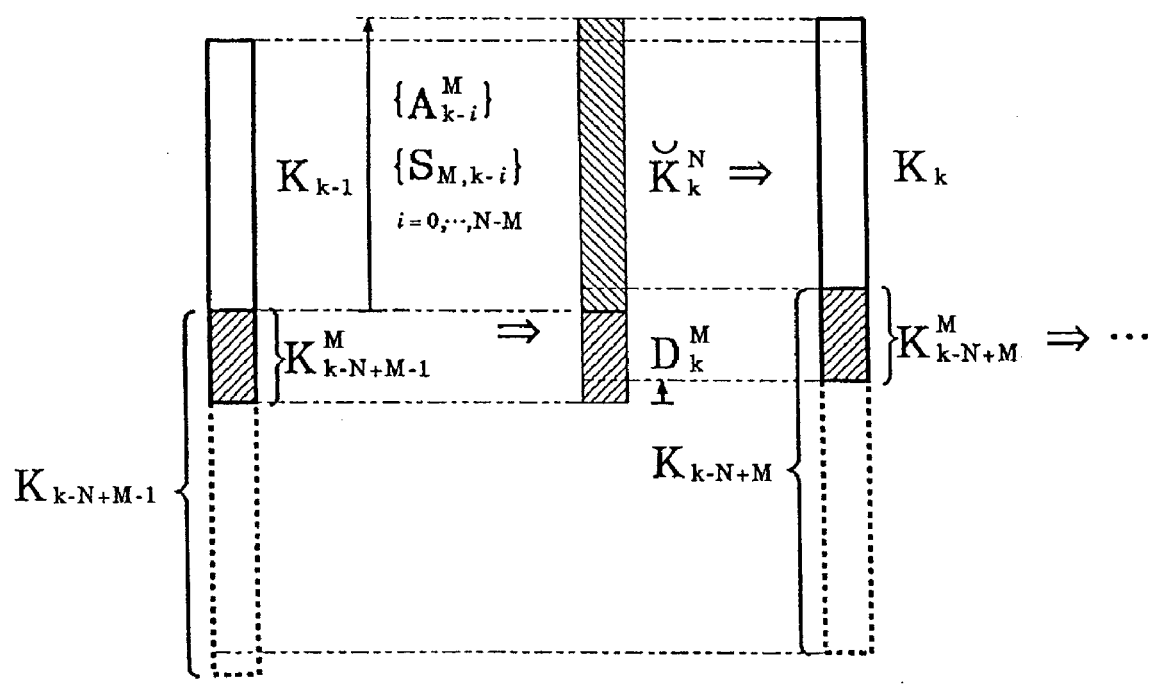
FIG. 1 An explanatory view showing update of a gain matrix of an order-recursive fast $H_\infty$ filter.

FIG. 1 is an explanatory view showing update of a gain matrix of an order-recursive fast $H_\infty$ filter.

This figure shows the summary of the above. By this, it is understood that $$K_{k-N+M-1}(1:M,:) = K_{k-1}(N-M+1:N,:)$$

is theoretically established.

This point will be explained below.

$K_{k-N+M-1}^{M}$ including the first to the M-th row of the N×2 gain matrix $K_{k-N+M-1}$ is extrapolated by using $A_{k-i}^{M}$ and $S_{M,\,k-i}$, and after the (N+1)×2 auxiliary gain matrix $K_{k}^{U\,N}$ is generated, the gain matrix $K_k$ at a next time is obtained using $D_k^M$, and this is repeated hereafter.

4.2 Derivation of the Order-Recursive Fast $H_\infty$ Filter

Next, a fast $H_\infty$ filter having an optimum expanded filter gain will be described.

Theorem 3 (Order-Recursive Fast $H_\infty$ Filter)

When an input signal is expressed by the M($\leq$N)-th order AR model, the fast $H_\infty$ filter is executed by a following expression and with the amount of calculation 3N+O(M).

[Mathematical Expression 23]

$$\hat{x}_{k|k} = \hat{x}_{k-1|k-1} + K_{s,k}(y_k - H_k \hat{x}_{k-1|k-1}) \quad (38)$$

$$K_{s,k} = \frac{K_k(:,1)}{1+\gamma_f^{-2} H_k K_k(:,1)} \in \mathcal{R}^{N\times 1}$$

$$K_k = m_k - D_k \mu_k, \; D_k = \begin{bmatrix} 0_{N-M} \\ D_k^m \end{bmatrix} \quad (39)$$

$$D_k^M = \frac{D_{k-1}^M - m_k(N-M+1:N,\,:)W\eta_{M,k}}{1-\mu_k W \eta_{M,k}}$$

$$\eta_{M,k} = c_{k-N} + \underline{C}_k^M D_{k-1}^M \quad (40)$$

$$\begin{bmatrix} m_k \\ \mu_k \end{bmatrix} = \tilde{K}_k^N, \; m_k \in \mathcal{R}^{N\times 2}, \; \mu_k \in \mathcal{R}^{1\times 2} \quad (41)$$

$$\tilde{K}_k^N = \begin{bmatrix} 0_{(N-M+1)\times 2} \\ \tilde{K}_{k-N+M-1}^{M-1} \end{bmatrix} + G_k^N, \; \tilde{K}_{k-N+M-1}^{M-1} = K_{k-N+M-1}(1:M,\,:) \quad (42)$$

$$S_{M,k} = \rho S_{M,k-1} + e_{M,k}^T W \tilde{e}_{M,k}, \; e_{M,k} = c_k + C_{k-1}^M A_k^M \quad (43)$$

$$A_k^M = A_{k-1}^M - K_{k-1}(1:M,\,:)W\tilde{e}_{M,k}, \; \tilde{e}_{M,k} = c_k + C_{k-1}^M A_{k-1}^M$$

Where, $G_k^N$ is updated as follows:

$$\begin{bmatrix} G_k^N \\ 0_{1\times 2} \end{bmatrix} = \begin{bmatrix} 0_{1\times 2} \\ G_{k-1}^N \end{bmatrix} + \quad (44)$$

$$\begin{bmatrix} e_{M,k}^T/S_{M,k} \\ A_k^M e_{M,k}^T/S_{M,k} \\ 0_{(N-M+1)\times 2} \end{bmatrix} - \begin{bmatrix} 0_{(N-M+1)\times 2} \\ e_{M,k-N+M-1}^T/S_{M,k-N+M-1} \\ A_{k-N+M-1}^M e_{M,k-N+M-1}^T/S_{M,k-N+M-1} \end{bmatrix}$$

Where, $\underline{C}_k^M = C_k(:,N-M+1:N)$, $C_{k-1}^M = C_{k-1}(:,1:M), \; C_k = \begin{bmatrix} H_k \\ H_k \end{bmatrix}$, $W = \begin{bmatrix} 1 & 0 \\ 0 & -\gamma_f^{-2} \end{bmatrix}$ $e_{f,i} = Z^v{}_{i|i} - H_i x_i, \; z^v{}_{i|i} = H_i \hat{x}{}_{i|i}$, $C_k \in \mathbb{R}^{3\times 1}$ is the first column vector of $C_k = [c_k, \ldots, c_{k-N+1}]$, $C_{k-i} = O_{2\times 1}$, $k-i < 0$, and initial values are set to be $K_0 = O_{N\times 2}$, $G_0^N = O_{(N+1)\times 2}$, $A_0^M = O_{M\times 1}$, $S_{M,0} = 1/\epsilon_0$, $D_0^M = 0_{M\times 1}$, $\hat{x}_{0|0} = x^v{}_0 = 0_{N\times 1}$.

Besides, a following scalar condition must be satisfied.

[Mathematical Expression 24]

$$-\varrho \hat{\Xi}_i + \rho \gamma_f^2 > 0, \; i = 0, \ldots, k \quad (45)$$

Here, $\varrho$, $\hat{\Xi}_i|$ are respectively defined by following expressions.

$$\varrho = 1 - \gamma_f^2, \; \hat{\Xi}_i = \frac{\rho H_i K_{s,i}}{1 - H_i K_{s,i}} = \frac{\rho H_i K_i(:,1)}{1 - (1 - \gamma_f^{-2}) H_i K_i(:,1)} \quad (46)$$

(Proof) It is obtained when the lemmas 1, 2 and 3 are applied to Theorem 2.

4.3 Mounting of the Order-Recursive Fast H∞ Filter

Figure 2:
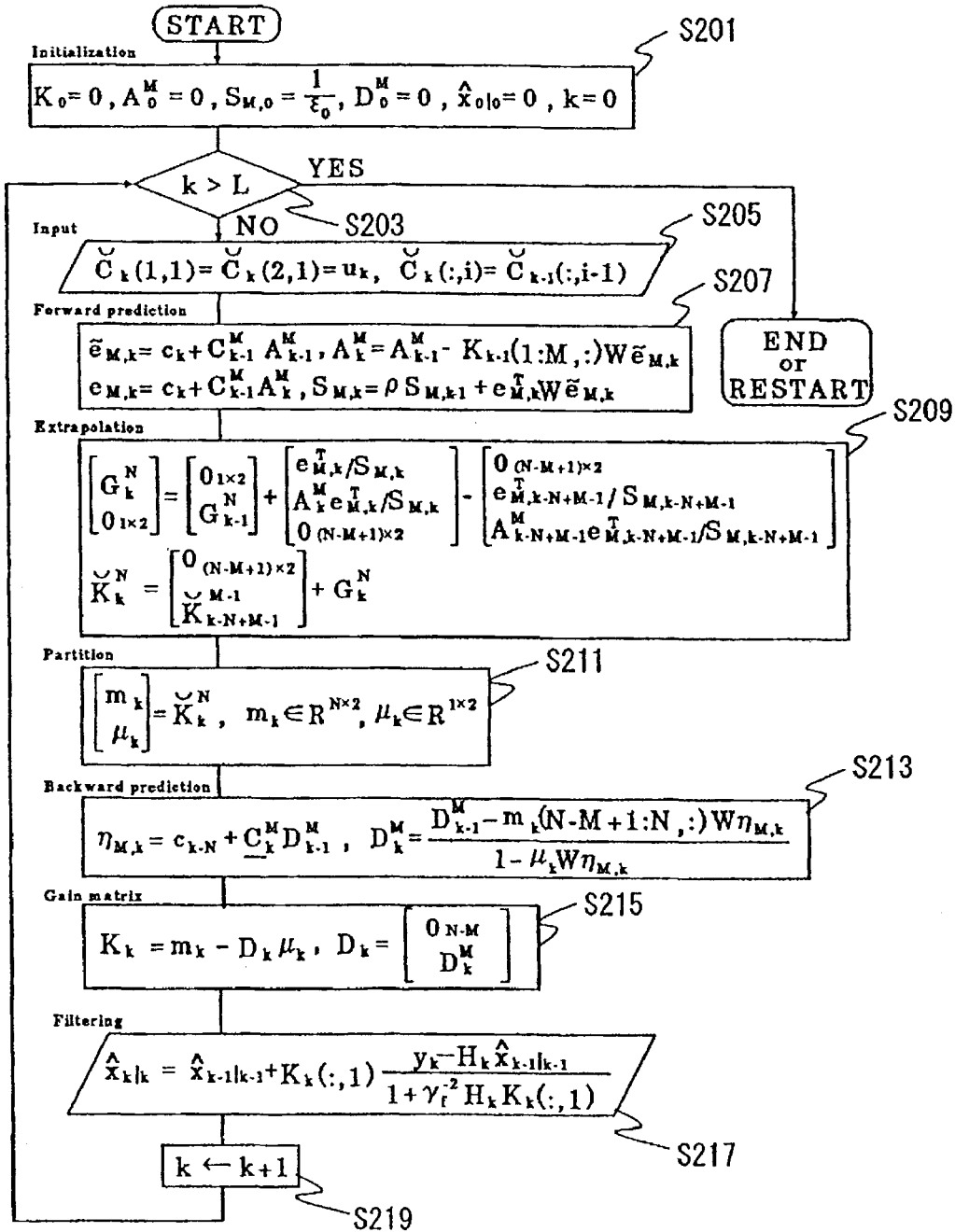
FIG. 2 A flowchart of a processing of the order-recursive fast $H_\infty$ filter.

FIG. 2 shows a flowchart of the order-recursive fast $H_\infty$ filter.

In order to reduce the amount of calculation, $K_k(:,1)/(1+\gamma_f^{-2} H_k K_k(:,1))$ was directly used instead of $K_{s,k}$.

Hereinafter, the processing of the order-recursive fast $H_\infty$ filter will be described with reference to a flowchart.

[Step S201, Initialization] The processing section 101 reads an initial state of a recursive equation from the storage section 105, or inputs the initial state from the input section 102, and determines it as shown in the figure.

[Step S203] The processing section 101 compares a time k with a maximum data number L. Incidentally, L denotes the previously determined maximum data number. When the time k is larger than the maximum data number, the processing section 101 ends the processing, and when not larger than that, advance is made to a next step. (If unnecessary, the conditional sentence can be removed. Alternatively, restart may be made as the need arises.)

[Step S205, Input] The processing section 101 inputs an input $u_k$ from the input section 102, and sets $C_k^U$ as shown in the figure. Incidentally, the input $u_k$ may be read from the storage section 105.

[Step S207, Forward prediction] The processing section 101 recursively determines variables $e_{M,k}$, $A_k^M$, $S_{M,k}$, $K_k(1:M,:)$ and the like by expression (43).

[Step S209, Extrapolation] The processing section 101 updates a matrix $G_k^N$ by expression (44), and calculates an auxiliary gain matrix $K_k^{U\,N}$ by expression (42).

[Step S211, Partition] The processing section 101 partitions the auxiliary gain matrix $K_k^{U\,N}$ by expression (41).

[Step S213, Backward prediction] The processing section 101 calculates a variable $D_k^M$ and a backward prediction error $\eta_{M,k}$ by expression (40).

[Step S215, Gain matrix] The processing section 101 calculates a gain matrix $K_k$ by expression (39).

[Step S217, Filtering] The processing section 101 updates a filter equation of the fast $H_\infty$ filter by expression (38). Here, in order to reduce the amount of calculation, $K_k(:,1)/(1+\gamma_f^{-2} H_k K_k(:,1))$ is directly used as a filter gain $K_{s,k}$.

[Step S219] The processing section 101 advances the time k (k=k+1), returns to step S203, and continues as long as data exists or a specified number of times.

Incidentally, the processing section 101 may store a suitable intermediate value and a final value obtained at the respective steps of the calculation steps S205 to S217 of the $H_\infty$ filter, a value of an existence condition and the like into the storage section 105 as the need arises, and may read them from the storage section 105.

Besides, it should be noted that the order-recursive fast $H_\infty$ filter is completely coincident with the fast $H_\infty$ filter when M=N is established.

Figure 3:
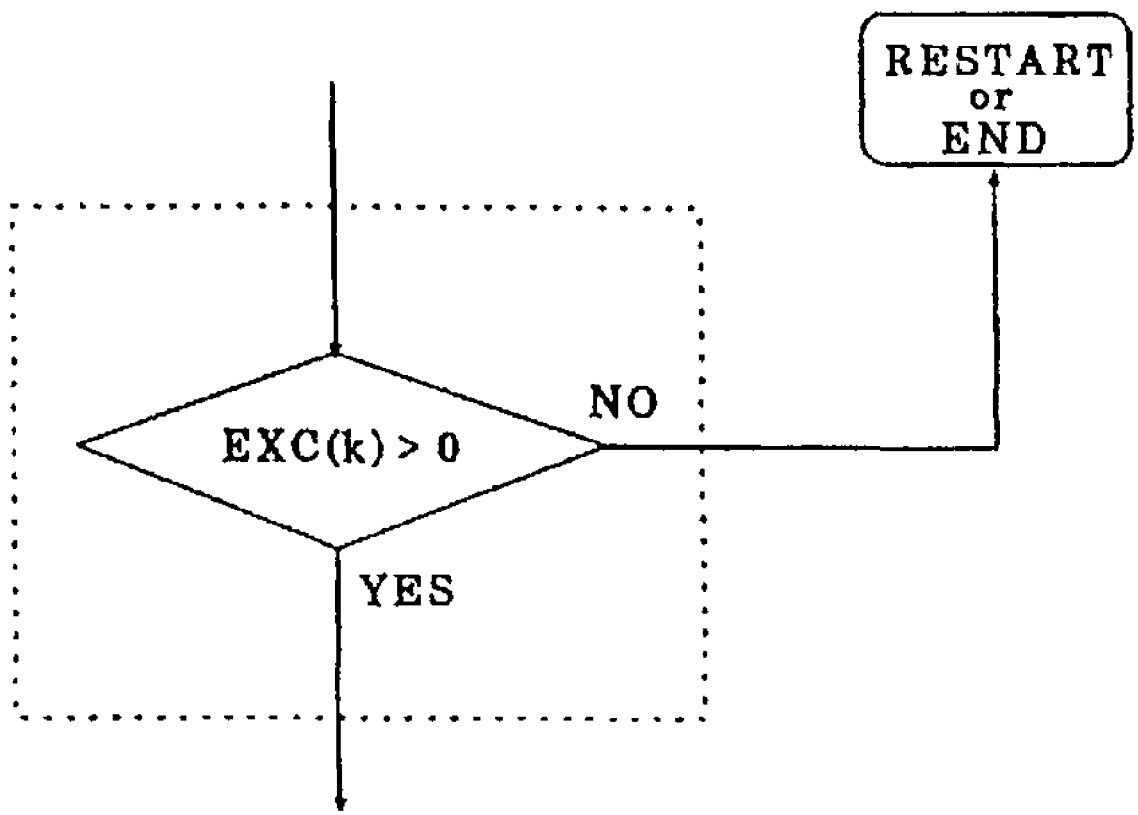
FIG. 3 A flowchart of a check of a scalar existence condition.

FIG. 3 is a flowchart of check of a scalar existence condition.

In general, a check function of the existence condition of FIG. 3 is added to the flowchart of FIG. 2. This step can be executed by the processing section 101 at a suitable timing before or after a suitable one step or plural steps of the flowchart of FIG. 2 or FIG. 4 (described later) or the step (S219) of advancing the time k. EXC(k) corresponds to the left side of the foregoing expression (45).

4.4 Calculation of Prediction Variable

As a method of obtaining variables $e_{M,\ k-N+M-1}$, $A_{k-N+M-1}^M$, $S_{M,\ k-N+M-1}$ and $K_{k-N+M-1}^{U\ M-1}$ (= $K_{k-N+M-1}^M = K_{k-N+M-1}$ (1:M,:) at the Extrapolation (step S209) of FIG. 2, there are following two methods.

1) Values of the variables obtained at the respective steps are held on a memory during N−M steps.

2) Values of the variables at a time $t_{k-N+M-1}$ are also again calculated at the respective steps (see FIG. 4 described later).

In general, the method of 1) is suitable for a DSP (Digital Signal Processor) having a large storage capacity, and the method of 2) is often suitable for a normal DSP, and either of the methods may be used.

Figure 4:
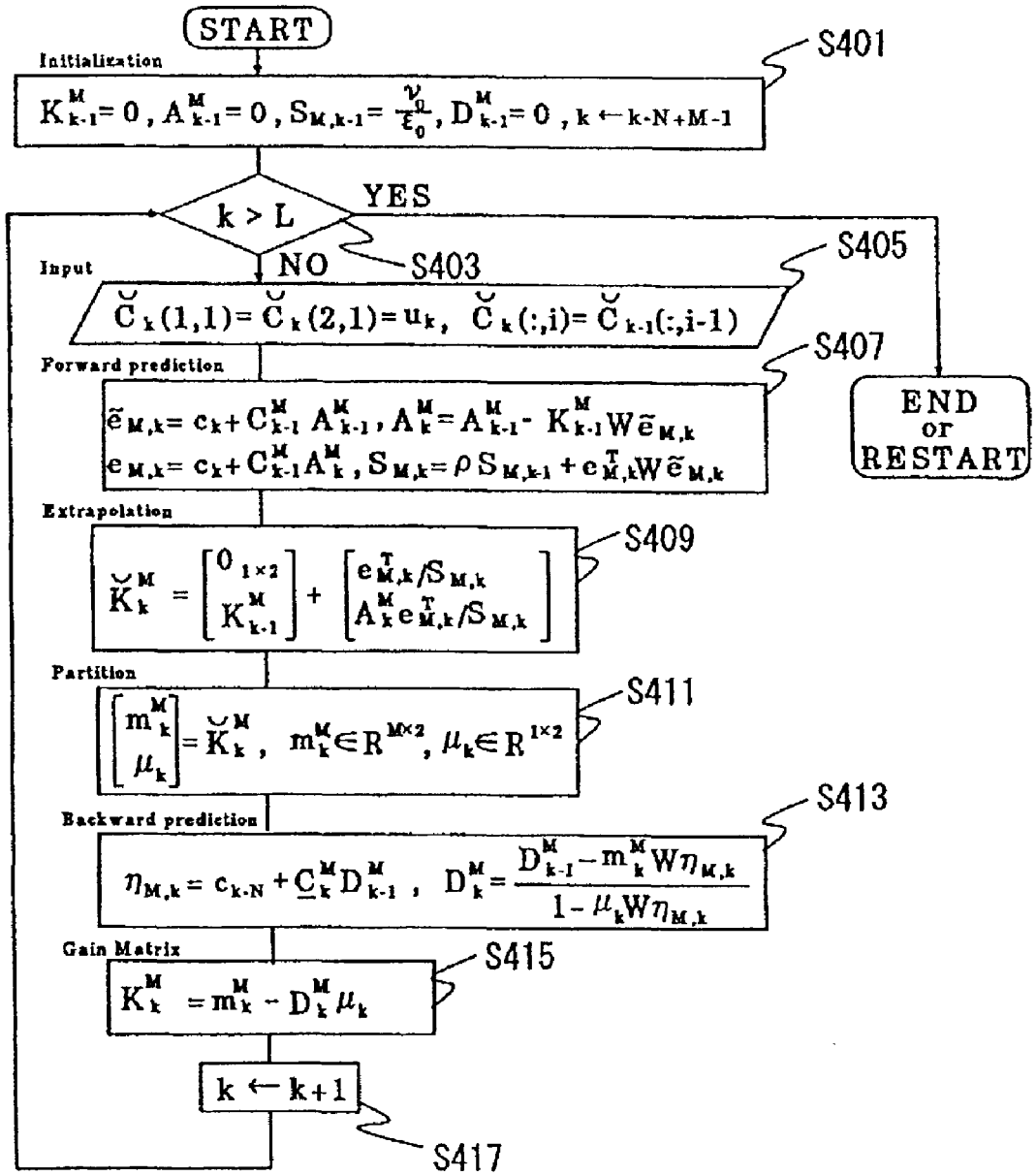
FIG. 4 A flowchart of a calculation processing of a value of a prediction variable at a time $t_{k-N+M-1}$.

FIG. 4 is a flowchart of a calculation method of values of prediction variables at the time $t_{k-N+M-1}$.

Hereinafter, a calculation processing of the values of the prediction variables at the time $t_{k-N+M-1}$ will be described with reference to the flowchart. The processing section 101 calculates the respective variables based on the flowchart, and uses the respective variables when step S209 or the like of the flowchart of FIG. 2 is calculated.

[Step S401, Initialization] The processing section 101 reads an initial state of a recursive equation from the storage section 105, or inputs the initial state from the input section 102, and determines it as shown in the figure.

[Step S403] The processing section 101 compares a time k with a maximum data number L. Incidentally, L denotes the previously determined maximum data number. When the time k is larger than the maximum data number, the processing section 101 ends the processing, and when not larger than that, advance is made to a next step. (If unnecessary, the conditional sentence can be removed. Alternatively, restart may be made as the need arises.)

[Step S405, Input] An input $u_k$ is inputted from the input section 102, and $C_k^U$ is set as shown in the figure. Incidentally, the input $u_k$ may be read from the storage section 105.

[Step S407, Forward prediction] The processing section 101 recursively determines variables $e_{M,\ k}$, $A_k^M$, $S_{M,\ k}$, $K_{k-1}^M$ and the like as shown in the figure (see expression (43)).

[Step S409, Extrapolation] The processing section 101 calculates an auxiliary gain matrix $K_k^{U\ M}$ as shown in the figure (see expression (42)).

[Step S411, Partition] The processing section 101 partitions the auxiliary gain matrix $K_k^{U\ M}$ as shown in the figure (see expression (41)).

[Step S413, Backward prediction] The processing section 101 calculates a variable $D_k^M$ and a backward prediction error $\eta_{M,\ k}$ as shown in the figure (see expression (40)).

[Step S415, Gain matrix] The processing section 101 calculates a gain matrix $K_k^M$ as shown in the figure (see expression (39)).

[Step S417] The processing section 101 advances the time k (k=k+1), returns to step S403, and continues as long as data exists or a specified number of times.

Incidentally, the processing section 101 may store a suitable intermediate value and a final value obtained at the respective steps of the calculation steps S405 to S415 of the $H_\infty$ filter, a value of an existence condition and the like into the storage section 105 as the need arises, or may read them from the storage section 105.

4.5 Backward Prediction Error

For numerical stabilization, instead of the backward prediction error $\eta_k$,

[Mathematical Expression 25]

$$\tilde{\eta}_k = \eta_k + \beta(\eta_{k-\rho}^{-N} S_k \mu_k^T) \quad (47)$$

can be adopted.

Figure 5:
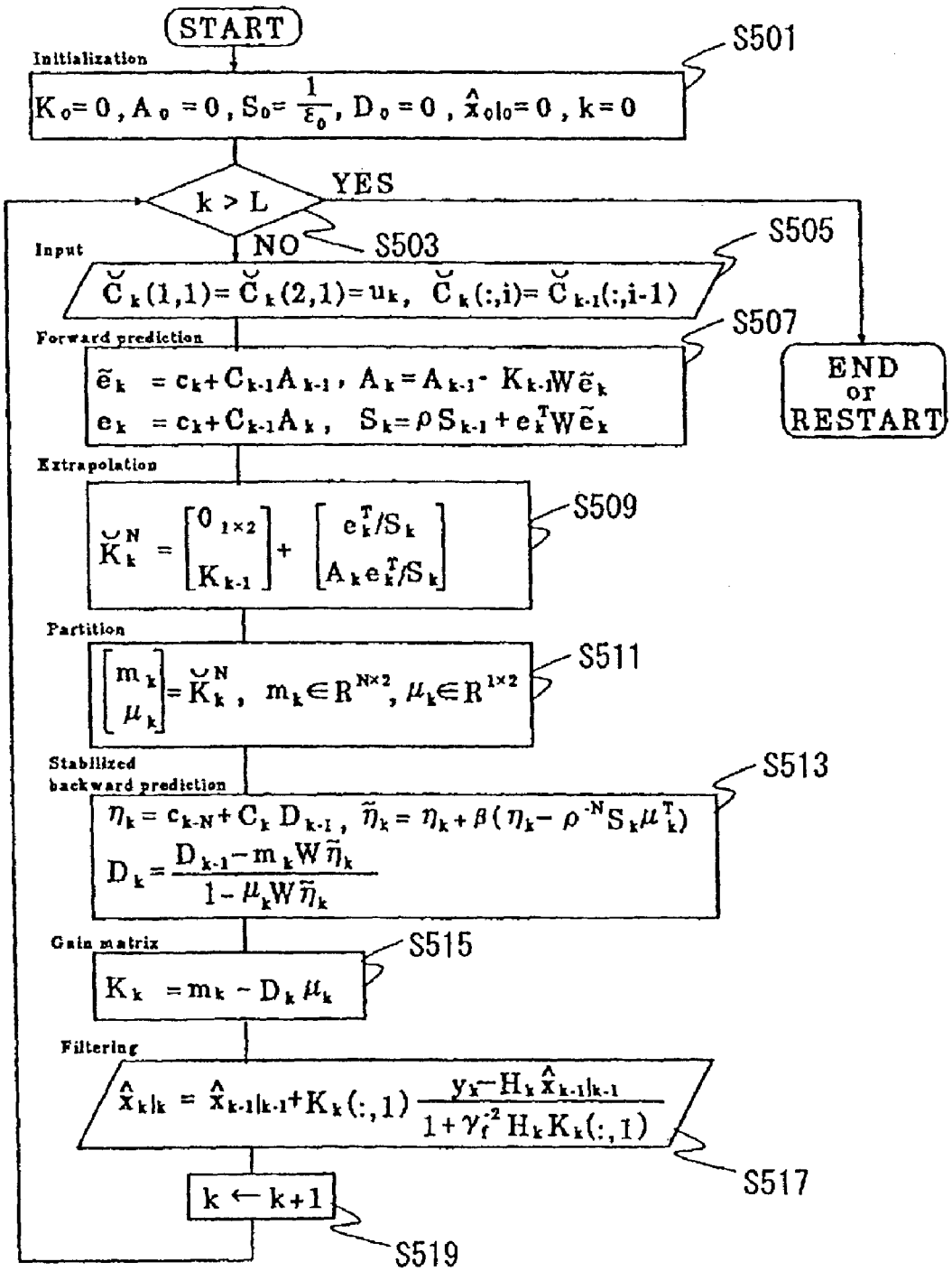
FIG. 5 A flowchart of a numerically stabilized fast $H_\infty$ filter processing.

FIG. 5 is a flowchart of a numerically stabilized fast $H_\infty$ filter (order-recursive fast $H_\infty$ filter at M=N).

In general, a check function of an existence condition of FIG. 3 is added to this flowchart. Besides, $\beta$ denotes a control parameter, and $\beta$ is generally made $\beta=1.0$. This stabilizing method can be applied also to a case of M<N.

Hereinafter, the processing of the numerically stabilized fast $H_\infty$ filter will be described with reference to the flowchart.

[Step S501, Initialization] The processing section 101 reads an initial state of a recursive equation from the storage section 105, or inputs the initial state from the input section 102, and determines it as shown in the figure.

[Step S503] The processing section 101 compares a time k with a maximum data number L. Incidentally, L denotes the previously determined maximum data number. When the time k is larger than the maximum data number, the processing section 101 ends the processing, and when not larger than that, advance is made to a next step. (If unnecessary, the conditional sentence can be removed. Alternatively, restart may be made as the need arises.)

[Step S505, Input] An input $u_k$ is inputted from the input section 102, and $C_k^U$ is set as shown in the figure. Incidentally, the input $u_k$ may be read from the storage section 105.

[Step S507, Forward prediction] The processing section 101 recursively determines variables $e_{M,\ k}$, $A_k$, $S_k$, $K_{k-1}$ and the like as shown in the figure (see expression (43)).

[Step S509, Extrapolation] The processing section 101 calculates an auxiliary gain matrix $K_k^{U\ N}$ as shown in the figure (see expression (42)).

[Step S511, Partition] The processing section 101 partitions the auxiliary gain matrix $K_k^{U\ N}$ as shown in the figure (see expression (41)).

[Step S513, Stabilized backward prediction] The processing section 101 calculates a variable $D_k^M$ and a backward prediction error $\eta_k$ as shown in the figure (see expression (40)). Here, for numerical stabilization, $\tilde{\eta}_k$ (expression (47)) is adopted instead of the backward prediction error $\eta_k$.

[Step S515, Gain matrix] The processing section 101 calculates a gain matrix $K_k^M$ as shown in the figure (see expression (39)).

[Step S517, Filtering] The processing section 101 updates a filter equation of the fast $H_\infty$ filter by expression (38). Here, in order to reduce the amount of calculation, $K_k(:, 1)/(1+\gamma_f^{-2} H_k K_k(:, 1))$ is directly used as the filter gain $K_{s,\ k}$.

[Step S519] The processing section 101 advances the time k (k=k+1), returns to step S503, and continues as long as data exists or a specified number of times.

Incidentally, the processing section 101 may store a suitable intermediate value and a final value obtained at the respective steps of the calculation steps S505 to S517 of the $H_\infty$ filter, a value of an existence condition and the like into the storage section 105 as the need arises, or may read them from the storage section 105.

5. Comparison Result

Figure 12:
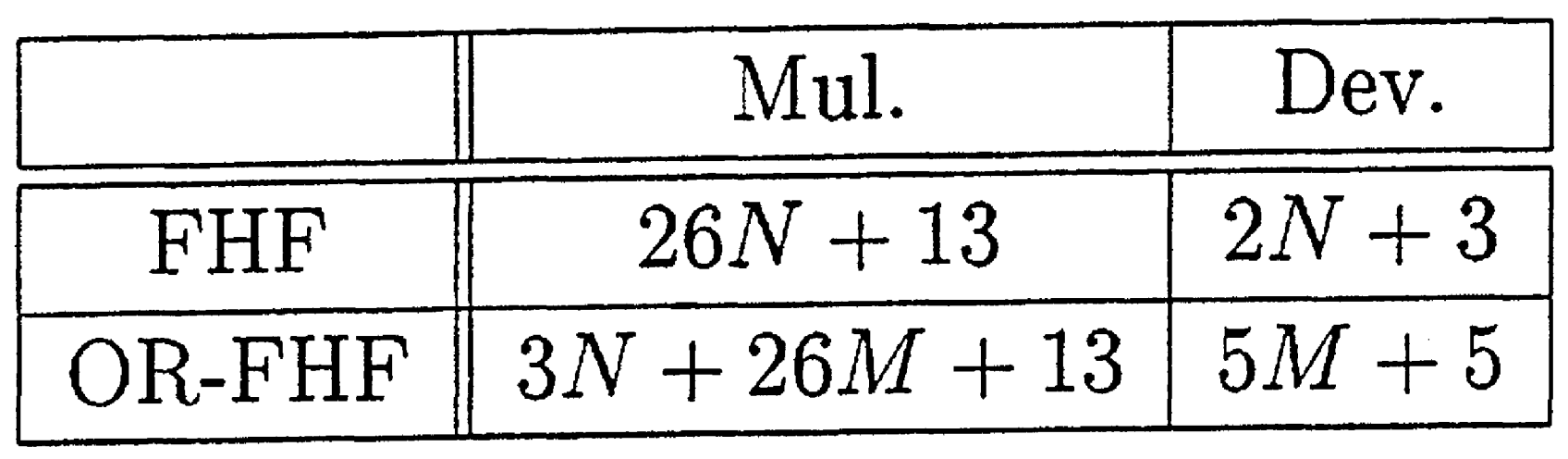

FIG. 12 is a view of result of comparison between the amount of calculation of the fast $H_\infty$ filter (FHF) and that of the order-recursive fast $H_\infty$ filter (OR-FHF).

However, this result is obtained in the case where calculation is performed in accordance with the expressions, and the amount of calculation can be further reduced by contrivance. Besides, division of a vector by a scalar can be counted as multiplication by taking the reciprocal of the scalar.

By this, when M<<N is established, the number of times of multiplication required for the order-recursive fast $H_\infty$ filter becomes about 3N, and it is understood that the amount of calculation can be greatly reduced as compared with the fast $H_\infty$ filter.

6. Echo Canceller

6.1 Preparation

Hereinafter, an example of an echo canceller is adopted as the embodiment, and the operation of the identification algorism is confirmed. Before that, the echo canceller will be described in brief.

Figure 6:
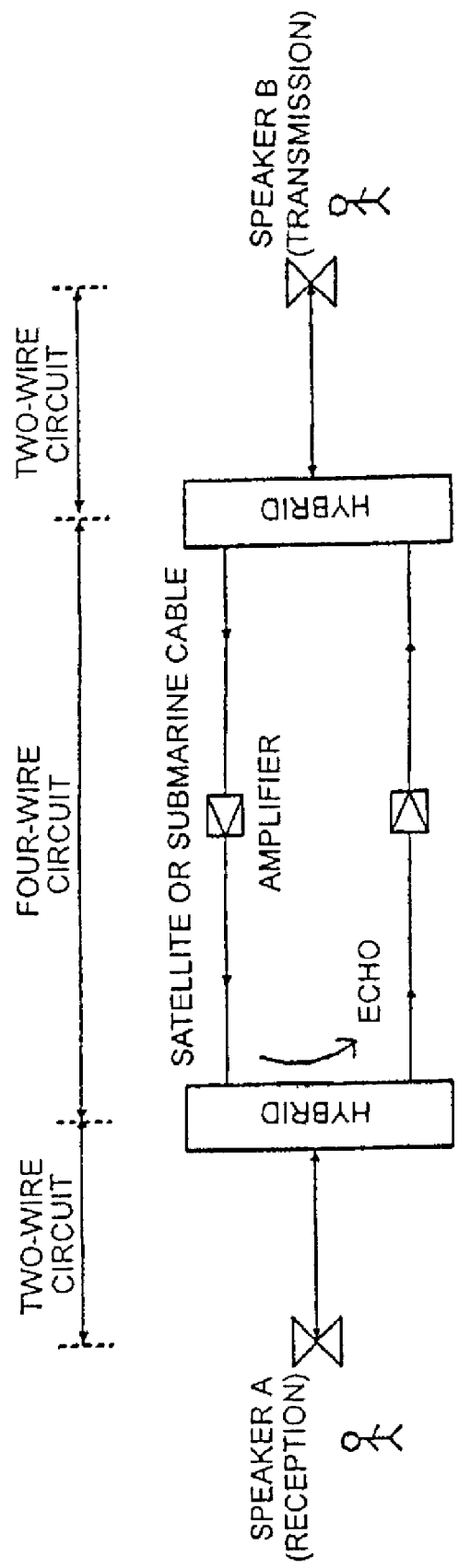
FIG. 6 An explanatory view of a communication system and an echo.

FIG. 6 is an explanatory view of a communication system and an echo.

In a long distance telephone circuit such as an international telephone, a four-wire circuit is used from the reason of signal amplification and the like. On the other hand, since a subscriber's circuit has a relatively short distance, a two-wire circuit is used. A hybrid transformer as shown in the figure is introduced at a connection part between the two-wire circuit and the four-wire circuit, and impedance matching is performed. When the impedance matching is complete, a signal (sound) from a speaker B reaches only a speaker A. However, in general, it is difficult to realize the complete matching, and there occurs a phenomenon in which part of the received signal leaks to the four-wire circuit, and returns to the receiver (speaker A) after being amplified. This is an echo. As a transmission distance becomes long (as a delay time becomes long), the influence of the echo becomes large, and the quality of a telephone call is remarkably deteriorated (in the pulse transmission, even in the case of short distance, the deterioration of a telephone call due to the echo can be a problem).

Figure 7:
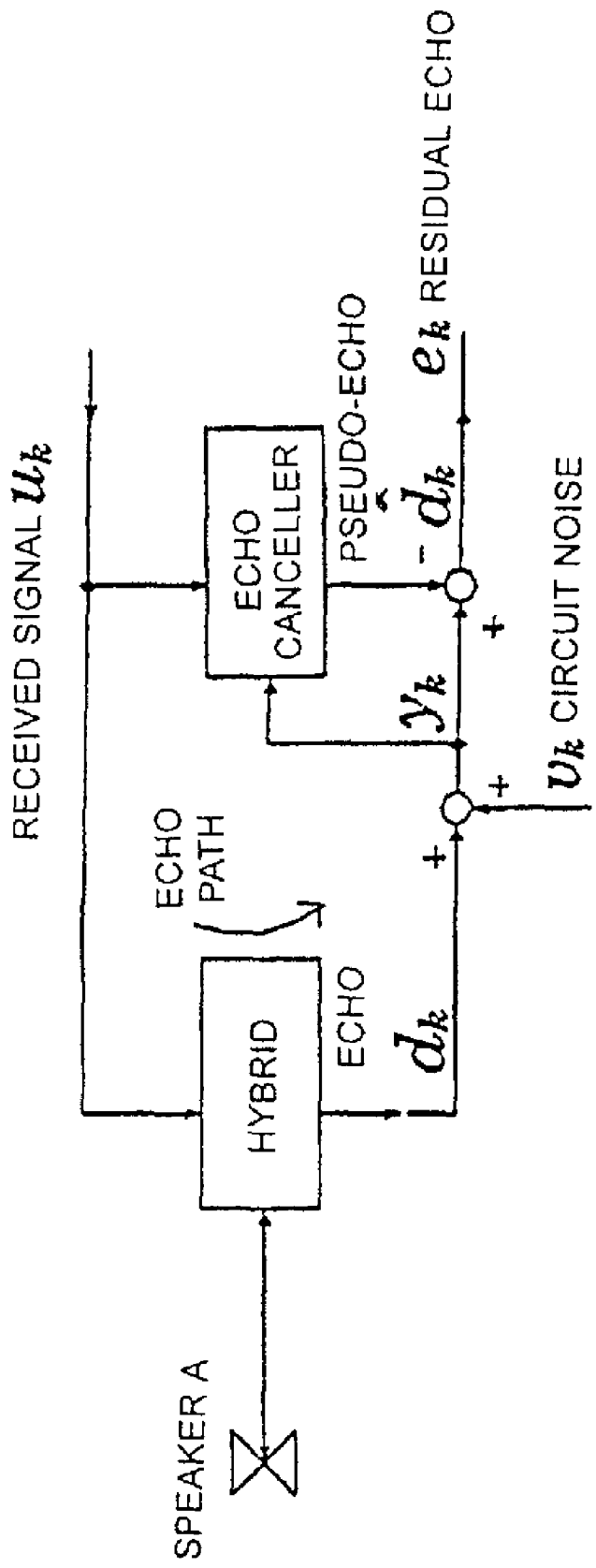
FIG. 7 A principle view of an echo canceller.

FIG. 7 is a principle view of an echo canceller.

As shown in the figure, the echo canceller is introduced, an impulse response of an echo path is successively estimated by using a received signal which can be directly observed and an echo, and a pseudo-echo obtained by using it is subtracted from the actual echo to cancel the echo and to remove it.

The estimation of the impulse response of the echo path is performed so that the mean square error of a residual echo $e_k$ becomes minimum. At this time, elements to interfere with the estimation of the echo path are circuit noise and a signal (sound) from the speaker A. In general, when two speakers simultaneously start to speak (double talk), the estimation of the impulse response is suspended. Besides, since the impulse response length of the hybrid transformer is, for example, about 50 [ms], when the sampling period is made 125 [μs], the order of the impulse response of the echo path becomes actually about 400.

Next, a mathematical model of this echo canceling problem is created. First, when consideration is given to the fact that the received signal $\{u_k\}$ becomes the input signal to the echo path, by the impulse response $\{h_i[k]\}$ of the echo path, an observed value $\{y_k\}$ of an echo $\{d_k\}$ is expressed by a following expression.

[Mathematical Expression 26]

$$y_k = d_k + v_k = \sum_{i=0}^{N-1} h_i[k] u_{k-i} + v_k, \quad (48)$$

$$k = 0, 1, 2, \ldots$$

Here, $u_k$ and $y_k$ respectively denote the received signal and the observed value of the echo at a time $t_k$ (=kT; T is a sampling period), $v_k$ denotes circuit noise of a mean value 0 at the time $t_k$, and it is assumed that a tap number N is known. At this time, when an estimated value $\{\hat{h}_i[k]\}$ of the impulse response is obtained every moment, the pseudo-echo can be generated by using that as described below.

[Mathematical Expression 27]

$$\hat{d}_k = \sum_{i=0}^{N-1} \hat{h}_i[k] u_{k-i}, \quad (49)$$

$$k = 0, 1, 2, \ldots$$

When this is subtracted from the echo ($y_k - \hat{d}_k \approx 0$), and the echo can be cancelled. Where, it is assumed that if k−i<0, then $u_{k-i}=0$.

From the above, the canceling problem can be reduced to the problem of successively estimating the impulse response $\{h_i[k]\}$ of the echo path from the received signal $\{u_k\}$ which can be directly observed and the observed value $\{y_k\}$ of the echo.

In general, in order to apply the $H_\infty$ filter to the echo canceller, first, expression (48) must be expressed by a state space model including a state equation and an observation equation. Then, when $\{h_i[k]\}$ is made a state variable $x_k$, and a variance of about $w_k$ is allowed, the following state space model can be established for the echo path.

[Mathematical Expression 28]

$$x_{k+1} = x_k + G_k w_k, \; x_k, \; w_k \in R^N \quad (50)$$

$$y_k = H_k x_k + v_k, \; y_k, \; v_k \in R \quad (51)$$

$$z_k = H_k x_k, \; z_k \in R, \; H_k \in R^{1 \times N} \quad (52)$$

Where,
$x_k = [h_0[k], \ldots, h_{N-1}[k]]^T$, $w_k = [w_k(1), \ldots, w_k(N)]^T$ $H_k = [u_k, \ldots u_{k-N+1}]$

6.2 Confirmation of Operation

FIG. 13 is a view showing an impulse response of an echo path.

With respect to the case where the impulse response of the echo path is temporally invariable ($h_i[k]=h_i$), and for example, the tap number N is 48, the operation of the fast algorithm is confirmed by using a simulation. At this time, the observed value $y_k$ of the echo is expressed by a following expression.

[Mathematical Expression 29]

$$y_k = \sum_{i=0}^{63} h_i u_{k-i} + v_k \quad (53)$$

Where, the values of FIG. 13 are used for the impulse response $\{h_i\}_{i=0}^{23}$, and the other $\{h_i\}_{i=24}^{63}$ is made 0. Besides, it is assumed that $v_k$ is stationary Gaussian white noise having a mean value of 0 and a variance $\sigma_v=1.0\times10^{-4}$, and the sampling period T is made 1.0 for convenience.

Besides, the received signal $\{u_k\}$ is approximated by a secondary AR model as follows:

[Mathematical Expression 30]

$$u_k = \alpha_1 u_{k-1} + \alpha_2 u_{k-2} + w'_k \qquad (54)$$

Where, $\alpha_1=0.7$, $\alpha_2=0.1$, and $W_k'$ is the stationary Gaussian white noise having a mean value of 0 and a variance $\sigma_{w'}^2=0.04$.

Figure 8:
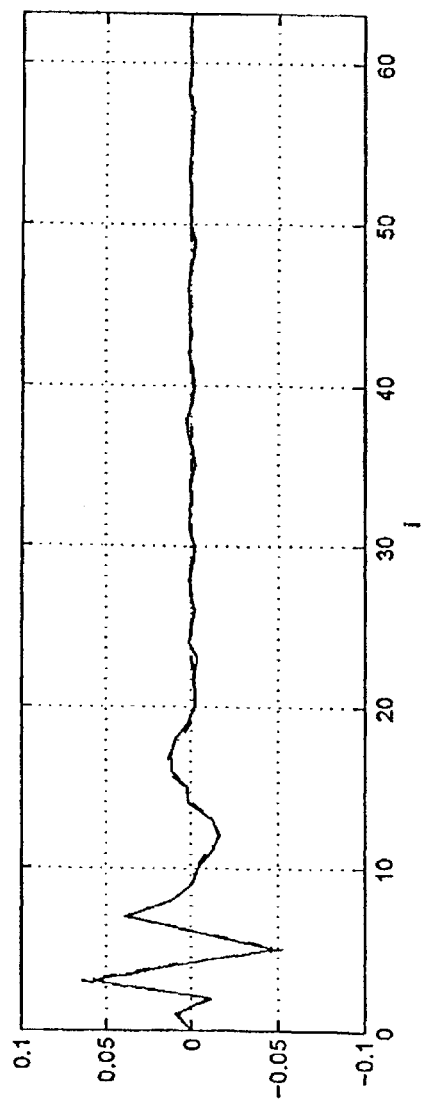
FIG. 8 A view showing an estimation result (performance evaluation) of an impulse response by the order-recursive fast $H_\infty$ filter.
Figure 8:
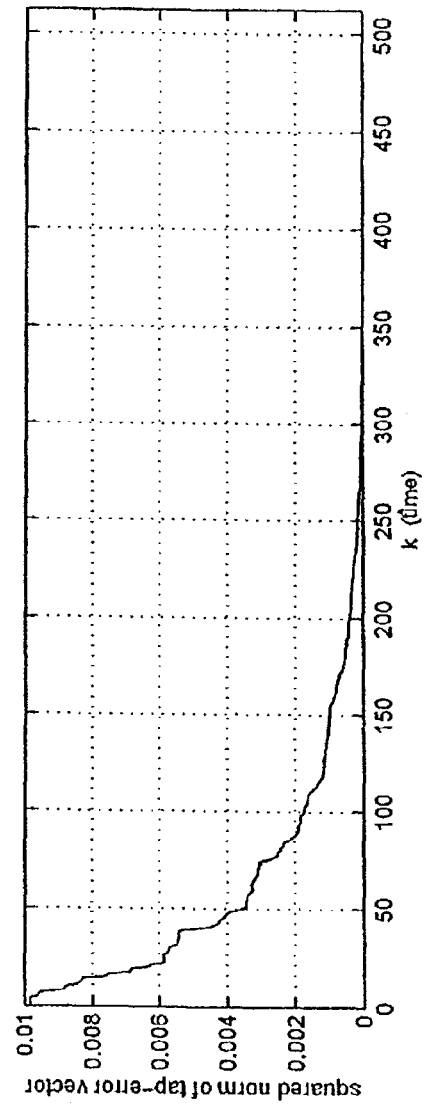

FIG. 8 is a view showing an estimation result (performance evaluation) of the impulse response by the order-recursive fast $H_\infty$ filter at M=2.

Here, FIG. 8A shows an estimated value ($X^\wedge_{256|256}$) of the impulse response at k=256 (broken line indicates a true value), and FIG. 8B shows a convergence characteristic thereof. Where, the vertical axis of FIG. 8B indicates $\|x_k - x^\wedge_{k|k}\|^2 = \Sigma_{i=0}^{63}(h_i - x^\wedge_k(i+1))^2$. By this, it is understood that the impulse response of the system can be excellently estimated by the order-recursive fast $H_\infty$ filter. Where, $\rho=1-\chi(\gamma_f)$, $\chi(\gamma_f)=\gamma_f^{-2}$, $x^\wedge_{0|0}=0$, $\gamma_f=10.0$, $\Sigma^\wedge_{1|0}=\epsilon_0 I$, and $\epsilon_0=10.0$ are assumed, and the calculation is performed at MATLAB (double precision)

Figure 9:
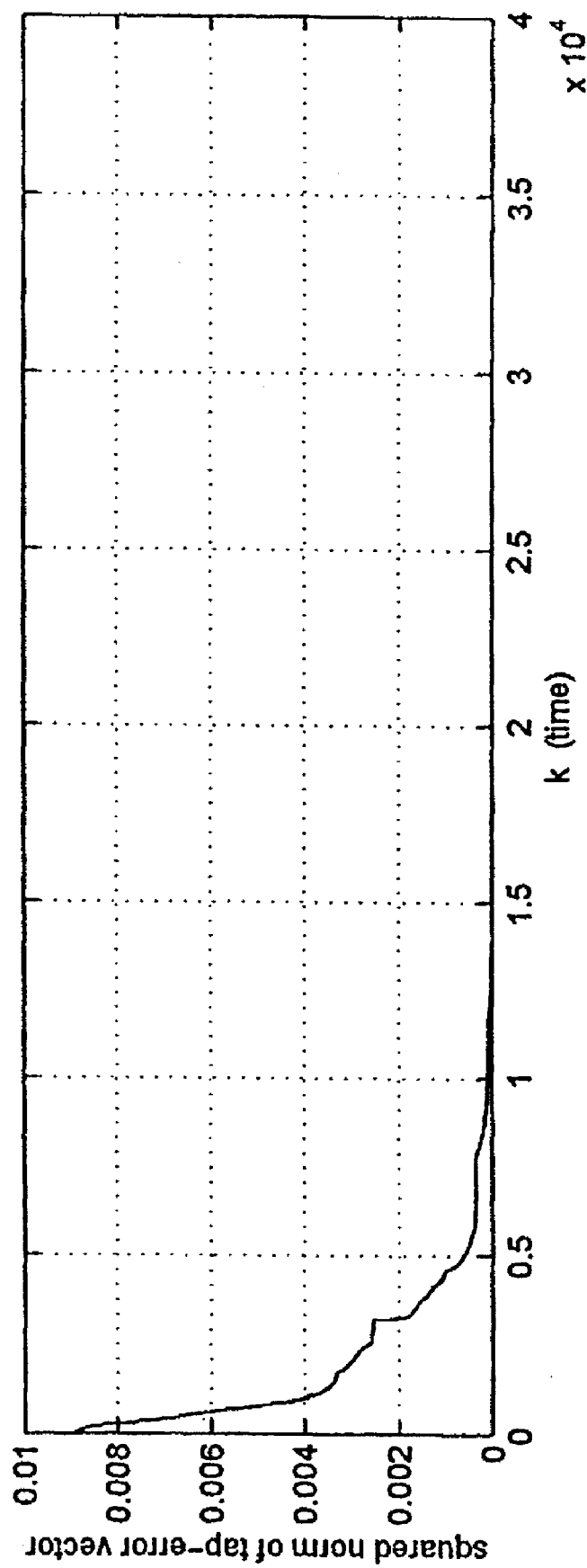
FIG. 9 A convergence characteristic view of the order-recursive fast $H_\infty$ filter with respect to a sound input.

FIG. 9 is a convergence characteristic view of the order-recursive fast $H_\infty$ filter with respect to sound input (in this example, N=512, M=20, $\gamma_f=54.0$).

Here, it is assumed that the order of the impulse response of an unknown system is 512, and the sound is a 20th order AR model. Besides, $\gamma_f=54.0$ and $\epsilon_0=1.0$ are assumed, and the calculation is performed at MATLAB (double precision). By this, it is understood that even when the input is sound, the order-recursive fast $H_\infty$ filter has excellent performance.

Figure 10:
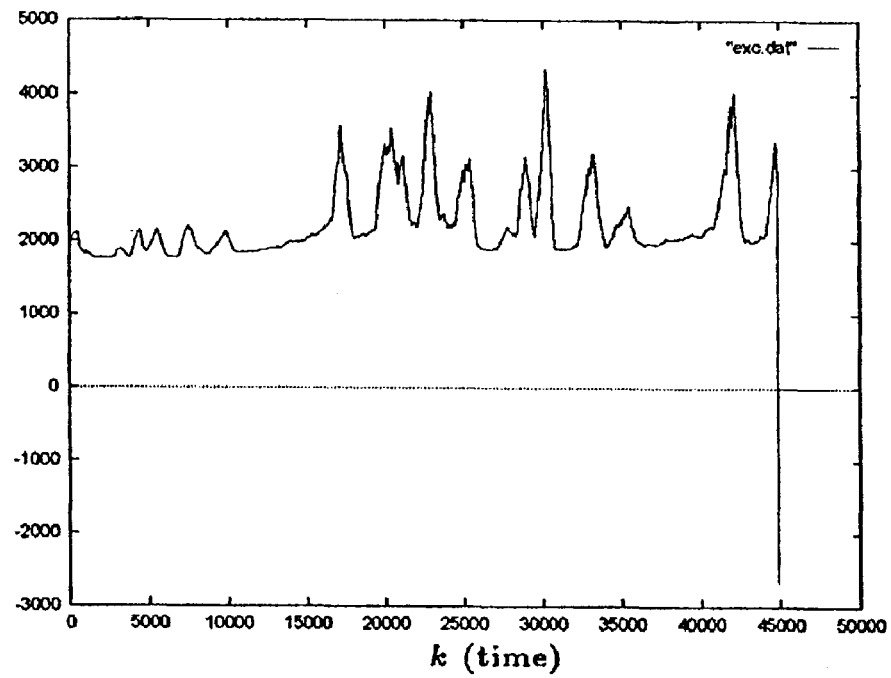
FIG. 10 A view of comparison of an existence condition.
Figure 10:
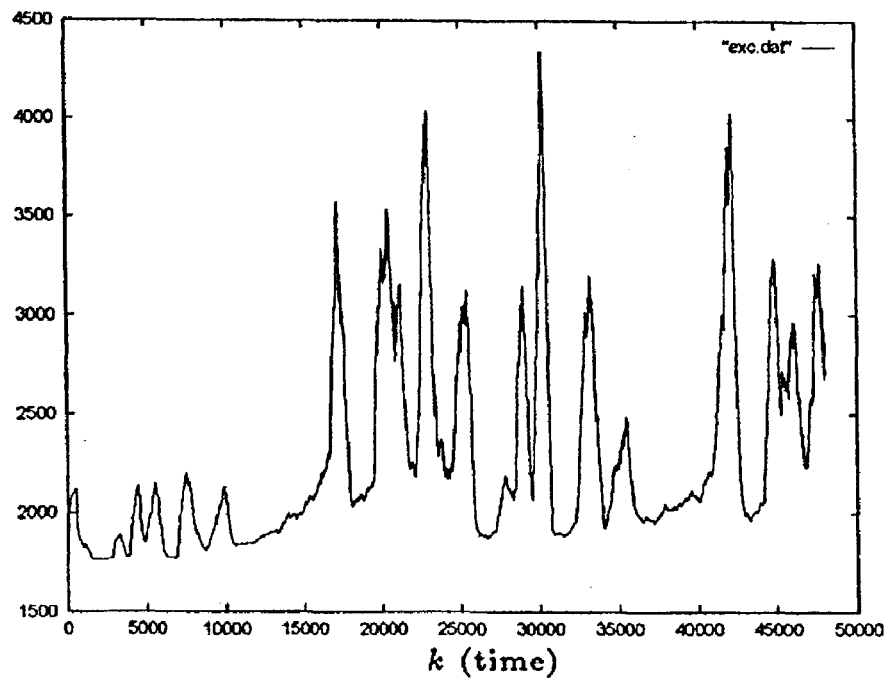

FIG. 10 is a view of comparison of an existence condition. This figure shows temporal changes of values of the left side (EXC(k)) of the scalar existence condition with respect to the fast $H_\infty$ filter (order-recursive fast $H_\infty$ filter at M=N) (FIG. 10A) and a numerically stabilized fast $H_\infty$ filter (FIG. 10B) (in this example, N=256, $\gamma_f=42.0$).

By this, in the case of the fast $H_\infty$ filter, the value of EXC (k) becomes negative at about 45000 steps, and the filter is stopped. On the other hand, in the numerically stabilized fast $H_\infty$ filter, EXC(k) always keeps a positive value in this section, and the existence condition is satisfied. However, the calculation is performed at single precision, and the same sound signal is used for each input.

7. Proof of Lemma

7.1 Proof of Lemma 1

When the dimension of a state vector is M, a following expression is obtained from expression (28).

[Mathematical Expression 31]

$$\tilde{K}_k^M = \begin{bmatrix} 0_{1\times 2} \\ \tilde{K}_{k-1}^{M-1} \end{bmatrix} + \frac{1}{S_{M,k}} \begin{bmatrix} e_{M,k}^T \\ A_k^M e_{M,k}^T \end{bmatrix} \qquad (55)$$

When this is applied to the case of the dimension of M+1, an auxiliary gain matrix $K_k^{U,M+1}$ is obtained.

[Mathematical Expression 32]

$$\tilde{K}_k^{M+1} = \begin{bmatrix} 0_{1\times 2} \\ \tilde{K}_{k-1}^M \end{bmatrix} + \frac{1}{S_{M+1,k}} \begin{bmatrix} e_{M+1,k}^T \\ A_k^{M+1} e_{M+1,k}^T \end{bmatrix} \qquad (56)$$

On the other hand, when an input signal can be expressed by an M-th order AR model, $e_{M,k}=\min\{e_{m,k}\}$ and $\tilde{e}_{M,k}=\min\{\tilde{e}_{m,k}\}$ are established for $m \geq M$. By this,

[Mathematical Expression 33]

$$e_{m,k} = c_k + C_{k-1}^m A_k^m = c_k + C_{k-1}^M A_k^M = e_{M,k} \qquad (57)$$

$$\tilde{e}_{m,k} = c_k + C_{k-1}^M A_{k-1}^M = \tilde{e}_{M,k}$$

$$A_k^m e_{m,k}^T = \begin{bmatrix} A_k^M e_{M,k}^T \\ 0_{(m-M)\times 1} \end{bmatrix}$$

$$S_{m,k} = S_{M,k} = \rho S_{M,k-1} + e_{M,k}^T W \tilde{e}_{M,k}$$

At this time, $$\tilde{Q}_k^{M+1} \begin{bmatrix} 0 \\ 1 \\ A_{k-1}^M \end{bmatrix} = \begin{bmatrix} 0 \\ S_{M,k-1} \\ 0_M \end{bmatrix}$$

is established. Thus, a following expression is obtained.

[Mathematical Expression 34]

$$\tilde{K}_k^{M+1} = \begin{bmatrix} 0_{1\times 2} \\ \tilde{K}_{k-1}^M \end{bmatrix} + \frac{1}{S_{M,k}} \begin{bmatrix} e_{M,k}^T \\ A_k^M e_{M,k}^T \\ 0_{1\times 2} \end{bmatrix}$$

$$= \begin{bmatrix} 0_{1\times 2} \\ 0_{1\times 2} \\ \tilde{K}_{k-2}^{M-1} \end{bmatrix} + \frac{1}{S_{M,k-1}} \begin{bmatrix} 0_{1\times 2} \\ e_{M,k-1}^T \\ A_{k-1}^M e_{M,k-1}^T \end{bmatrix} + \frac{1}{S_{M,k}} \begin{bmatrix} e_{M,k}^T \\ A_k^M e_{M,k}^T \\ 0_{1\times 2} \end{bmatrix}$$

Similarly, when the repetition is made up to N, at last, by using $A_{k-1}^M$, $S_{M,k-1}$ satisfying $$\tilde{Q}_{k-i}^M \begin{bmatrix} 1 \\ A_{k-i}^M \end{bmatrix} = \begin{bmatrix} S_{M,k-i} \\ 0_M \end{bmatrix}$$

that is,

[Mathematical Expression 35]

$$\tilde{Q}_k^N \begin{bmatrix} 0_i \\ 1 \\ A_{k-1}^M \\ 0_{N-M-i} \end{bmatrix} = \begin{bmatrix} 0_i \\ S_{M,k-1} \\ 0_M \\ 0_{N-M-i} \end{bmatrix}$$

the auxiliary gain matrix $K^{U\,N}_k$ can be expressed as follows:

[Mathematical Expression 36]

$$\breve{K}^N_k = \begin{bmatrix} 0_{(N-M+1)\times 2} \\ \breve{K}^{M-1}_{k-N+M-1} \end{bmatrix} + \sum_{i=0}^{N-M} \frac{1}{S_{M,k-i}} \begin{bmatrix} 0_{i\times 2} \\ e^T_{M,k-i} \\ A^M_{k-i} e^T_{M,k-i} \\ 0_{(N-M-i)\times 2} \end{bmatrix}$$

7.2 Proof of Lemma 2

An auxiliary variable $G^N_k$ is defined as

[Mathematical Expression 37]

$$G^N_k = \sum_{i=0}^{N-M} \frac{1}{S_{M,k-i}} \begin{bmatrix} 0_{i\times 2} \\ e^T_{M,k-i} \\ A^M_{k-i} e^T_{M,k-i} \\ 0_{(N-M-i)\times 2} \end{bmatrix}$$

At this time, when attention is paid to $G^N_k(i-1,:) = G^N_{k-1}(i,:)$, it becomes

[Mathematical Expression 38]

$$\begin{bmatrix} G^N_k \\ 0_{1\times 2} \end{bmatrix} - \begin{bmatrix} 0_{1\times 2} \\ G^N_{k-1} \end{bmatrix} = \\ \frac{1}{S_{M,k}} \begin{bmatrix} e^T_{M,k} \\ A^M_k e^T_{M,k} \\ 0_{(N-M+1)\times 2} \end{bmatrix} - \frac{1}{S_{M,k-N+M-1}} \begin{bmatrix} 0_{(N-M+1)\times 2} \\ e^T_{M,k-N+M-1} \\ A^M_{k-N+M-1} e^T_{M,k-N+M-1} \end{bmatrix}$$

By this, expression (35) is established. Thus, the auxiliary gain matrix $K^{U\,N}_k$ is equivalent to expression (34) (expression (42)).

7.3 Proof of Lemma 3

When an input signal is expressed by an $M(\leq N)$-th order AR model, it becomes

[Mathematical Expression 39]

$$\eta_k = c_{k-N} + C_k D_{k-1} = c_{k-N} + \underline{C}^M_k D^M_{k-1} \quad (58)$$

$$\breve{Q}^M_{k-N+M} \begin{bmatrix} D^M_k \\ 1 \end{bmatrix} = \begin{bmatrix} 0_M \\ (F^M_k)^{-1} \end{bmatrix}$$

$$\left( \breve{Q}^N_k \begin{bmatrix} D_k \\ 1 \end{bmatrix} = \breve{Q}^N_k \begin{bmatrix} 0_{N-M} \\ D^M_k \\ 1 \end{bmatrix} \right)$$

When attention is paid to this, expression (36) and expression (37) are obtained by a similar method to non-patent document 2.

INDUSTRIAL APPLICABILITY

The fast identification method of the invention can be applied to the identification of a large-scale sound system or communication system, and is effective for an echo canceller in a loudspeaker or a television meeting system, active noise control, sound field reproduction and the like. Besides, by the development of the numerically stabilizing method, the operation can be made more stably even at single precision, and higher performance can be realized at low cost.

In a normal civil communication equipment or the like, in general, calculation is often performed at single precision from the viewpoint of cost and speed. Thus, the invention, as the practical fast identification method, would have the effect in various industrial fields.

The invention claimed is:

1. A system identification device, for a communication system or a sound system, for performing real-time identification of a time-invariant or time-variant system in which real-time characteristics of signal or sound are provided as an input to the system device; the system identification device comprising:
    a processor; and,
    a filter, being included in said processor, that is robust against a disturbance by being configured to determine that a maximum energy gain to a filter error from the disturbance, as an evaluation criterion, is restricted to be smaller than a predetermined upper limit $\gamma_f^2$;
    wherein,
    the filter satisfies an $H_\infty$ evaluation criterion as indicated by following expression (14) with respect to a state space model as indicated by following expressions (11) to (13),
    when an input signal is expressed by an $M(\leq N)$-th order autoregressive model (AR model), the filter is given by following expressions (38) to (44), and
    the filter satisfies a scalar existence condition of following expressions (45) and (46):

$$x_{k+1} = x_k + G_k w_k, \; w_k, x_k \in \mathcal{R}^N \quad (11)$$

$$y_k = H_k x_k + v_k, \; y_k, v_k \in \mathcal{R} \quad (12)$$

$$z_k = H_k x_k, \; z_k \in \mathcal{R}, \; H_k \in \mathcal{R}^{1\times N} \quad (13)$$

$$\sup_{x_0,\{w_i\},\{v_i\}} \frac{\sum_{i=0}^{k} \|e_{f,i}\|^2/\rho}{\|x_0 - \breve{x}_0\|^2_{\Sigma_0^{-1}} + \sum_{i=0}^{k} \|w_i\|^2 + \sum_{i=0}^{k} \|v_i\|^2/\rho} < \gamma_f^2 \quad (14)$$

$$\hat{x}_{k|k} = \hat{x}_{k-1|k-1} + K_{s,k}(y_k - H_k \hat{x}_{k-1|k-1}) \quad (38)$$

$$K_{s,k} = \frac{K_k(:,1)}{1 + \gamma_f^{-2} H_k K_k(:,1)} \in \mathcal{R}^{N\times 1}$$

$$K_k = m_k - D_k \mu_k, \; D_k = \begin{bmatrix} 0_{N-M} \\ D^M_k \end{bmatrix} \quad (39)$$

$$D^M_k = \frac{D^M_{k-1} - m_k(N-M+1:N,:)W\eta_{M,k}}{1 - \mu_k W \eta_{M,k}}$$

$$\eta_{M,k} = c_{k-N} + \underline{C}^M_k D^M_{k-1} \quad (40)$$

$$\begin{bmatrix} m_k \\ \mu_k \end{bmatrix} = \breve{K}^N_k, \; m_k \in \mathcal{R}^{N\times 2}, \; \mu_k \in \mathcal{R}^{1\times 2} \quad (41)$$

$$\breve{K}^N_k = \begin{bmatrix} 0_{(N-M+1)\times 2} \\ \breve{K}^{M-1}_{k-N+M-1} \end{bmatrix} + G^N_k, \; \breve{K}^{M-1}_{k-N+M-1} = K_{k-N+M-1}(1:M,:) \quad (42)$$

$$S_{M,k} = \rho S_{M,k-1} + e^T_{M,k} W \tilde{e}_{M,k}, \; e_{M,k} = c_k + C^M_{k-1} A^M_k \quad (43)$$

$$A^M_k = A^M_{k-1} - K_{k-1}(1:M,:)W\tilde{e}_{M,k}, \; \tilde{e}_{M,k} = c_k + C^M_{k-1} A^M_{k-1}$$

$G_k^N$ is updatable as follows:

$$\begin{bmatrix} G_k^N \\ 0_{1\times 2} \end{bmatrix} = \begin{bmatrix} 0_{1\times 2} \\ G_{k-1}^N \end{bmatrix} + \begin{bmatrix} e_{M,k}^T/S_{M,k} \\ A_k^M e_{M,k}^T/S_{M,k} \\ 0_{(N-M+1)\times 2} \end{bmatrix} - \qquad (44)$$

$$\begin{bmatrix} 0_{(N-M+1)\times 2} \\ e_{M,k-N+M-1}^T/S_{M,k-N+M-1} \\ A_{k-N+M-1}^M e_{M,k-N+M-1}^T/S_{M,k-N+M-1} \end{bmatrix}$$

where, $\underline{C}_k^M = C_k(:, N-M+1:N)$, $\check{C}_{k-1}^M = C_{k-1}(:, 1:M)$, $C_k = \begin{bmatrix} H_k \\ H_k \end{bmatrix}, W = \begin{bmatrix} 1 & 0 \\ 0 & -\gamma_f^{-2} \end{bmatrix}$ $e_{f,i} = z_{i|i}^v - H_i x_i$, $z_{i|i}^v = H_i \hat{x}_{i|i}$ ($C_k \in R^{2\times 1}$ is a first column vector of $C_k = [c_k, \ldots, c_{k-N+1}]$, $c_{k-1} = 0_{2\times 1}$ and k−i<0 are assumed, and initial values are set to be $K_0 = 0_{N\times 2}$, $G_0^N = 0_{(N+1)\times 2}$, $A_0^M = 0_{M\times 1}$, $S_{M,0} = 1/\epsilon_0$, $D_0^M = 0_{M\times 1}$, $\hat{x}_{0|0} = x^v 0 = 0_{N\times 1}$, $0_{m\times n}$ denotes an m×n zero matrix)

$$-\varrho \hat{\Xi}_i + \rho \gamma_f^2 > 0, i = 0, \ldots, k \qquad (45)$$

$\varrho$, $\hat{\Xi}_i$ are respectively defined by following expressions:

$$\varrho = 1 - \gamma_f^2, \hat{\Xi}_i = \frac{\rho H_i K_{s,i}}{1 - H_i K_{s,i}} = \frac{\rho H_i K_i(:,1)}{1-(1-\gamma_f^{-2})H_i K_i(:,1)} \qquad (46)$$

where, for the communication system or the sound system, $x_k$ is defined as an unknown estimated state vector or a state $x_0$ is defined as an unknown initial state $w_k$ is defined as an unknown system noise, $v_k$ is defined as an unknown observation noise, $y_{ak}$ is defined as an observation signal and a known input of the filter, $z_k$ is defined as an unknown output signal, $G_k$ is defined as a drive matrix and becomes known at execution, $H_z$ is defined as a known observation matrix, $\hat{x}_{k|k}$ is defined as an estimated value of the state $x_k$ at a time k using observation signals $y_0-y_k$ and is given by a filter equation, $K_{s,k}$ is defined as a filter gain and is obtained from a gain matrix $K_k$, ρ is defined as a forgetting factor and when $\gamma_f$ is determined, is automatically determined by $\rho = 1 - \chi(\gamma_f)$, $\Sigma_0^1$ is defined as a known inverse matrix of a weighting matrix expressing uncertainty of a state, N is defined as a predetermined dimension (tap number) of a state vector, M is defined as a predetermined order of an AR model, $\mu_k$ is defined as N+1th row vector of $K_k^{U\,N}$; obtained from $K_k^{U\,N}$, $m_e$ is defined as N×2 matrix including a first to an N-th row of $K_k^{U\,N}$; obtained from $K_k^{U\,N}$, $\gamma_f$ is defined as an attenuation level and is given at design time, $D_i^m$ is defined as a backward prediction coefficient vector and is obtained from $m_k$, $\eta_{M,k}$ and $\mu_k$, W is defined as a weighting matrix and is determined from $\gamma_f$, $A_m$ is defined as a forward prediction coefficient vector and is obtained from $K_{k-1}$ and $e_{m,k}$, $C_a^m$ is defined as a 2×M matrix including a 1st to an M-th column vector of $C_k$ and is determined from the observation matrix $H_k$, $C_k^M$ is defined as a 2×M matrix including an N−M+1-th to an N-th column vector of $C_k$ and is determined from the observation matrix $H_k$, $K_k^{U\,N}$ is defined as the auxiliary gain matrix, and $\eta_{MAKE}$ is defined as a backward prediction error; and wherein said processor of said filter of said system identification device is configured to perform for the communication system or the sound system real-time identification of the time-invariant or time-variant system based on said input signal, to control the quality of the communication or sound system.

2. The system identification device according to claim 1, wherein it is assumed that the input signal is expressed by the M(≦N)-th order autoregressive model (AR model), and wherein the processor of the filter is configured to optimally generate a (N+1)×2 auxiliary gain matrix $K_k^{U\,N} = Q_k^{U\,-1} C_k^{U\,T}$ from an M×2 gain matrix, wherein $Q_k^U$ is expressed by $$\check{Q}_k = \rho \check{Q}_{k-1} + \check{C}_k^T W \check{C}_k \qquad (32)$$

$C_k^U = [C_k \, c_{k-N}] = [c_k \, C_{k-1}]$, and where, $C_k = \begin{bmatrix} H_k \\ H_k \end{bmatrix}, W = \begin{bmatrix} 1 & 0 \\ 0 & -\gamma_f^{-2} \end{bmatrix}$ 3. The system identification device according to claim 1, wherein the processor of the filter is configured to adopt a following expression $\tilde{\eta}_k$ instead of a backward prediction error $\eta_k$ for numeral stabilization:

$$\tilde{\eta}_k = \eta_k + \beta(\eta_{k-\rho}^{-N} S_k \mu_k^T) \qquad (47)$$

4. The system identification device according to claim 1, wherein the processor of the filter is configured to read an initial state of a recursive equation from a storage section or input the initial state from an input section and determining it, the processor is further configured to input an input $u_k$ from the input section or read it from the storage section and set $C_k^U$, $K_k^U(1:M,:)$, the processor is further configured to recursively determine variables $e_{M,k}$, $A_k^M$, $S_{M,k}$ and $K_k(1:M,:)$ by expression (43), the processor is further configured to update the matrix $G_k^N$ by expression (44) and calculate an auxiliary gain matrix $K_k^{U\,N}$ as in expression (42), the processor is further configured to partition the auxiliary gain matrix $K_k^{U\,N}$ by expression (41), the processor is further configured to calculate a variable $D_k^M$ and a backward prediction error $\eta_{M,k}$ by expression (40), the processor is further configured to calculate the gain matrix $K_k$ by expression (39), the processor is further configured to update the filter equation of a $H_\infty$ filter by expression (38), and the processor is further configured to advance the time k and repeat the respective steps.

5. The system identification device according to claim 1, wherein the processor of the filter is configured to obtain, at the step of calculation by expression (44), variables $e_{M,\,k-N+m-1}$, $A_{k-N+M-1}^{M}$, $S_{M,\,k-N+M-1}$, $K_{k-N+M-1}^{U\ M-1}$ (= $K_{k-n+M-1}^{M}$=$K_{k-N+M-1}(1:M,:)$) by one of following substeps of:
  1) holding values of the variables obtained at the respective steps on a memory during N−M steps, and
  2) re-calculating values of the variables at a time $t_{k-N+M-1}$ at the respective steps.

6. The system identification device according to claim 1, wherein
the filter is applied to obtain a state estimated value $\hat{x}_{k|k}$,
a pseudo-echo $\hat{d}_k$ is estimated as in a following expression, and this is subtracted from an echo to cancel the echo, $$\hat{d}_k = \sum_{i=0}^{N-1} \hat{h}_i[k]u_{k-i},\ k=0,1,2,\ldots \tag{49}$$

where,
$\hat{x}_{k|k}=[\hat{h}_0[k],\ldots \hat{h}_{N-1}[k]]^T$,
$u_k$ and $y_k$ respectively denote observed values of a received signal and the echo at the time $t_k$ (=kT; T is a sampling period),
$v_k$ denotes circuit noise having a mean value of 0 at the time $t_k$, and
N denotes the tap number (known).

7. A method of system identification using a system identification device for a communication system or a sound system, for performing real-time identification of a time invariable or time variable system, the method comprising:
providing real-time characteristics of signal or sound as an input signal for a system identification device;
providing the system identification device comprising a filter that is robust against a disturbance by determining that a maximum energy gain to a filter error from the disturbance, as an evaluation criterion, is restricted to be smaller than a predetermined upper limit $\gamma_f^2$,
wherein,
the filter satisfies an $H_\infty$ evaluation criterion as indicated by following expression (14) with respect to a state space model as indicated by following expressions (11) to (13),
when an input signal is expressed by an M(≤N)-th order autoregressive model (AR model), the filter is given by following expressions (38) to (44), and
the filter satisfies a scalar existence condition of following expressions (45) and (46):

$$x_{k+1} = x_k + G_k w_k,\ w_k,\ x_k \in \mathcal{R}^N \tag{11}$$

$$y_k = H_k x_k + v_k,\ y_k,\ v_k \in \mathcal{R} \tag{12}$$

$$z_k = H_k x_k,\ z_k \in \mathcal{R},\ H_k \in \mathcal{R}^{1\times N} \tag{13}$$

$$\sup_{x_0,\{w_i\},\{v_i\}} \frac{\sum_{i=0}^{k}\|e_{f,i}\|^2/\rho}{\|x_0-\bar{x}_0\|_{\Sigma_0^{-1}}^2 + \sum_{i=0}^{k}\|w_i\|^2 + \sum_{i=0}^{k}\|v_i\|^2/\rho} < \gamma_f^2 \tag{14}$$

-continued $$\hat{x}_{k|k} = \hat{x}_{k-1|k-1} + K_{s,k}(y_k - H_k \hat{x}_{k-1|k-1}) \tag{38}$$

$$K_{s,k} = \frac{K_k(:,1)}{1+\gamma_f^{-2}H_k K_k(:,1)} \in \mathcal{R}^{N\times 1}$$

$$K_k = m_k - D_k \mu_k,\ D_k = \begin{bmatrix} 0_{N-M} \\ D_k^M \end{bmatrix} \tag{39}$$

$$D_k^M = \frac{D_{k-1}^M m_k(N-M+1:N,:)W\eta_{M,k}}{1-\mu_k W\eta_{M,k}}$$

$$\eta_{M,k} = c_{k-N} + \underline{C}_k^M D_{k-1}^M \tag{40}$$

$$\begin{bmatrix} m_k \\ \mu_k \end{bmatrix} = \tilde{K}_k^N,\ m_k \in \mathcal{R}^{N\times 2},\ \mu_k \in \mathcal{R}^{1\times 2} \tag{41}$$

$$\tilde{K}_k^N = \begin{bmatrix} 0_{(N-M+1)\times 2} \\ \tilde{K}_{k-N+M-1}^{M-1} \end{bmatrix} + G_k^N,\ \tilde{K}_{k-N+M-1}^{M-1} = K_{k-N+M-1}(1:M,:) \tag{42}$$

$$S_{M,k} = \rho S_{M,k-1} + e_{M,k}^T W \tilde{e}_{M,k},\ e_{M,k} = c_k + C_{k-1}^M A_k^M$$

$$A_k^M = A_{k-1}^M - K_{k-1}(1:M,:)W\tilde{e}_{M,k},\ \tilde{e}_{M,k} = c_k + C_{k-1}^M A_{k-1}^M \tag{43}$$

wherein $G_k^N$ is updated as follows:

$$\begin{bmatrix} G_k^N \\ 0_{1\times 2} \end{bmatrix} = \begin{bmatrix} 0_{1\times 2} \\ G_{k-1}^N \end{bmatrix} + \begin{bmatrix} e_{M,k}^T/S_{M,k} \\ A_k^M e_{M,k}^T/S_{M,k} \\ 0_{(N-M+1)\times 2} \end{bmatrix} - \begin{bmatrix} 0_{(N-M+1)\times 2} \\ e_{M,k-N+M-1}^T \\ S_{M,k-N+M-1} \\ \frac{A_{k-N+M-1}^M e_{M,k-N+M-1}^T}{S_{M,k-N+M-1}} \end{bmatrix} \tag{44}$$

where,
$\underline{C}_k^M = C_k(:,N-M+1:N)$, $$C_{k-1}^M = C_{k-1}(:,1:M),\ C_k = \begin{bmatrix} H_k \\ H_k \end{bmatrix},$$

$$W = \begin{bmatrix} 1 & 0 \\ 0 & -\gamma_f^{-2} \end{bmatrix}$$

$e_{f,i}=z^v_{i|i}-H_i x_i$, $z^v_{i|i}=H_i \hat{x}_{i|i}$
($C_k \in \mathcal{R}^{2\times 1}$ is a first column vector of $C_k=[c_k,\ldots,C_{k-N+1}]$, $c_{k-1}=0_{2\times 1}$ and k−i<0 are assumed, and initial values are set to be $K_0=0_{N\times 2}$, $G_0^N=0_{(N+1)\times 2}$, $A_0^M=0_{M\times 1}$, $S_{M,0}=1/\epsilon_0$, $D_0^M=0_{M\times 1}$, $\hat{x}_{0|0}=\bar{x}^v 0=0_{N\times 1}$, here, $0_{m\times n}$ denotes an m×n zero matrix)

$$-\varrho\hat{\Xi}_i + \rho\gamma_f^2 > 0,\ i=0,\ldots,k \tag{45}$$

here, $\varrho$, $\hat{\Xi}_i$ are respectively defined by following expressions:

$$\varrho = 1 - \gamma_f^{-2},\ \hat{\Xi}_i = \frac{\rho H_i K_{s,i}}{1-H_i K_{s,i}} = \frac{\rho H_i K_i(:,1)}{1-(1-\gamma_f^{-2})H_i K_i(:,1)} \tag{46}$$

where, for the communication system or the sound system,
$x_k$ is defined as an unknown estimated state vector a state,
$x_0$ is defined as an unknown initial state,
$w_k$ is defined as an unknown system noise,
$v_k$ is defined as an observation noise,
$y_k$ is defined as an observation signal and a known input of the filter, $z_k$ is defined as an unknown output signal, $G_k$ is defined as a drive matrix and becomes known at execution, $H_k$ is defined as a known observation matrix, $\hat{x}_{k|k}$ is defined as an estimated value of the state $x_k$ at a time k using observation signals $y_0 - y_k$ and is given by a filter equation, $K_{s,k}$ is defined as a filter gain and is obtained from a gain matrix $K_k$, $\rho$ is defined as a forgetting factor and, when $\gamma_f$ is determined, is automatically determined by $\rho = 1 - \chi(\gamma_f)$, $\Sigma_0^{-1}$ is defined as a known inverse matrix of a weighting matrix expressing uncertainty of a state, N is defined as a predetermined dimension (tap number) of a state vector, M is defined as a predetermined order of an AR model $\mu_k$ is defined as N+1th row vector of $K^U_k{}^N$; obtained from $K^U_k{}^N$, $m_k$ is defined as N×2 matrix including a first to an N-th row of $K^U_k{}^N$; obtained from $K^U_k{}^N$, $\gamma_f$ is defined as an attenuation level and is given at design time, $D_k^M$ is defined as a backward prediction coefficient vector and is obtained from $m_k$, $\eta_{M,k}$ and $\mu_k$, W is defined as a weighting matrix and is determined from $\gamma_f$, $A_k^M$ is defined as a forward prediction coefficient vector and is obtained from $K_{k-1}$ and $e_{M,k}$, $C_k^M$ is defined as a 2×M matrix including a 1st to an M-th column vector of $C_k$ and is determined from the observation matrix $H_k$, $C_k^M$ is defined as a 2×M matrix including an N−M+1-th to an N-th column vector of $C_k$ and is determined from the observation matrix $H_k$, $K^U_k{}^N$ is defined as the auxiliary gain matrix, and $\eta_{M,k}$ is defined as a backward prediction error;

the method further comprising by using a processor of said filter of said system identification device, performing for the communication system or the sound system real-time identification of the time-invariant or time-variant system based on said input signal, to control the quality of the communication or sound system.

8. The method of claim 7, wherein it is assumed that the input signal is expressed by the M($\leq$N)-th order autoregressive model (AR model), and the method further comprising optimally generating, by using the processor of the filter, a (N+1)×2 auxiliary gain matrix $K^U_k{}^N = Q^U_k{}^{-1} C^U_k{}^T$ from an M×2 gain matrix, wherein $Q^U_k$ is expressed by $$\check{Q}_k = \rho \check{Q}_{k-1} + \check{C}_k^T W \check{C}_k \quad (32)$$

$C^U_k = [C_k \ c_{k-N}] = [c_k \ C_{k-1}]$, where, $$C_k = \begin{bmatrix} H_k \\ H_k \end{bmatrix}, W = \begin{bmatrix} 1 & 0 \\ 0 & -\gamma_f^{-2} \end{bmatrix}$$

9. The method according to claim 7, the method further comprising by using the processor of the filter, adopting a following expression $\tilde{\eta}_k$ instead of a backward prediction error $\eta_k$ for numeral stabilization:

$$\tilde{\eta}_k = \eta_k + \beta(\eta_{k-\rho}^{-N} S_k \mu_k^T) \quad (47)$$

10. The method according to claim 7, wherein the method further comprises by using the processor of the filter, reading an initial state of a recursive equation from a storage section or inputting the initial state from an input section and determining it, by using the processor, inputting an input $u_k$ from the input section or reading it from the storage section and setting $C^U_k$, $K^U_k(1:M,:)$, by using the processor, recursively determining variables $e_{M,k}$, $A_k^M$, $S_{M,k}$ and $K_k(1:M,:)$ by expression (43), by using the processor, updating the matrix $G_k^N$ by expression (44) and calculating an auxiliary gain matrix $K^U_k{}^N$ as in expression (42), by using the processor, partitioning the auxiliary gain matrix $K^U_k{}^N$ by expression (41), by using the processor, calculating a variable $D_k^M$ and a backward prediction error $\eta_{M,k}$ by expression (40), by using the processor, calculating the gain matrix $K_k$ by expression (39), by using the processor, updating the filter equation of a $H_\infty$ filter by expression (38), and by using the processing section, advancing the time k and repeating the respective steps.

11. The method according to claim 7, the method further comprising:

by using the processor of the filter, obtaining, at the step of calculation by expression (44), variables $e_{M,\ k-N+m-1}$, $A_{k-N+M-1}^M$, $S_{M,\ k-N+M-1}$, $K^U_{k-N+M-1}{}^{M-1}$ (= $K_{k-n+M-1}^M = K_{k-N+M-1}(1:M,:)$) by one of following substeps of:

1) holding values of the variables obtained at the respective steps on a memory during N−M steps, and 2) re-calculating values of the variables at a time $t_{k-N+M-1}$ at the respective steps.

12. The method according to claim 7, further comprising applying the filter to obtain a state estimated value $\hat{x}_{k|k}$, a pseudo-echo $\hat{d}_k$ is estimated as in a following expression, and this is subtracted from an echo to cancel the echo, $$\hat{d}_k = \sum_{i=0}^{N-1} \hat{h}_i[k] u_{k-i}, k = 0, 1, 2, \ldots \quad (49)$$

where, $\hat{x}_{k|k} = [\hat{h}_0[k], \ldots, \hat{h}_{N-1}[k]]^T$, $u_k$ and $y_k$ respectively denote observed values of a received signal and the echo at the time $t_k$, $v_k$ denotes circuit noise having a mean value of 0 at the time $t_k$, and N denotes the tap number.

13. A non-transitory computer readable recording medium, for a communication system or a sound system, which, when executed, causes a computer to perform the following instructions:

providing real-time characteristics of signal or sound as an input signal for a filter;

providing a filter for real-time identification of a time invariable or time variable system, the filter being robust against a disturbance by determining that a maximum energy gain to a filter error from the disturbance, as an evaluation criterion, is restricted to be smaller than a predetermined upper limit $\gamma_f^2$, wherein the filter satisfies an $H_\infty$ evaluation criterion as indicated by following expression (14) with respect to a state space model as indicated by following expressions (11) to (13), when an input signal is expressed by an M($\leq$N)-th order autoregressive model (AR model), the filter is given by following expressions (38) to (44), and the filter satisfies a scalar existence condition of following expressions (45) and (46):

$$x_{k+1} = x_k + G_k w_k, w_k, x_k \in \mathcal{R}^N \tag{11}$$

$$y_k = H_k x_k + v_k, y_k, v_k \in \mathcal{R} \tag{12}$$

$$z_k = H_k x_k, z_k \in \mathcal{R}, H_k \in \mathcal{R}^{1 \times N} \tag{13}$$

$$\sup_{x_0, \{w_i\}, \{v_i\}} \frac{\sum_{i=0}^{k} \|e_{f,i}\|^2 / \rho}{\|x_0 - \check{x}_0\|_{\Sigma_0^{-1}}^2 + \sum_{i=0}^{k} \|w_i\|^2 + \sum_{i=0}^{k} \|v_i\|^2 / \rho} < \gamma_f^2 \tag{14}$$

$$\hat{x}_{k|k} = \hat{x}_{k-1|k-1} + K_{s,k}(y_k - H_k \hat{x}_{k-1|k-1}) \tag{38}$$

$$K_{s,k} = \frac{K_k(:,1)}{1 + \gamma_f^{-2} H_k K_k(:,1)} \in \mathcal{R}^{N \times 1}$$

$$K_k = m_k - D_k \mu_k, D_k = \begin{bmatrix} 0_{N-M} \\ D_k^M \end{bmatrix} \tag{39}$$

$$D_k^M = \frac{D_k^N - m_k(N-M+1:N,:) W \eta_{M,k}}{1 - \mu_k W \eta_{M,k}}$$

$$\eta_{M,k} = c_{k-N} + C_k^M D_{k-1}^M \tag{40}$$

$$\begin{bmatrix} m_k \\ \mu_k \end{bmatrix} = \tilde{K}_k^N, m_k \in \mathcal{R}^{N \times 2}, \mu_k \in \mathcal{R}^{1 \times 2} \tag{41}$$

$$\tilde{K}_k^N = \begin{bmatrix} 0_{(N-M+1) \times 2} \\ \tilde{K}_{k-N+M-1}^{M-1} \end{bmatrix} + G_k^N, \tilde{K}_{k-N+M-1}^{M-1} = K_{k-N+M-1}(1:M,:) \tag{42}$$

$$S_{M,k} = \rho S_{M,k-1} + e_{M,k}^T W \tilde{e}_{M,k}, e_{M,k} = c_k + C_{k-1}^M A_k^M$$

$$A_k^M = A_{k-1}^M - K_{k-1}(1:M,:) W \tilde{e}_{M,k}, \tilde{e}_{M,k} = c_k + C_{k-1}^M A_{k-1}^M \tag{43}$$

$G_k^N$ is updated as follows:

$$\begin{bmatrix} G_k^N \\ 0_{1 \times 2} \end{bmatrix} = \begin{bmatrix} 0_{1 \times 2} \\ G_{k-1}^N \end{bmatrix} + \tag{44}$$

$$\begin{bmatrix} e_{M,k}^T / S_{M,k} \\ A_k^M e_{M,k}^T / S_{M,k} \\ 0_{(N-M+1) \times 2} \end{bmatrix} - \begin{bmatrix} 0_{(N-M+1) \times 2} \\ e_{M,k-N+M-1}^T / S_{M,k-N+M-1} \\ A_{k-N+M-1}^M e_{M,k-N+M-1}^T / S_{M,k-N+M-1} \end{bmatrix}$$

where, $$\underline{C}_k^M = C_k(:, N-M+1:N),$$

$$C_{k-1}^M = C_{k-1}(:,1:M), C_k = \begin{bmatrix} H_k \\ H_k \end{bmatrix},$$

$$W = \begin{bmatrix} 1 & 0 \\ 0 & -\gamma_f^{-2} \end{bmatrix}$$

$e_{f,i} = z^v{}_{i|i} - H_i x_i, z^v{}_{i|i} = H_i \hat{x}{}_{i|i}$ ($C_k \in R^{2 \times 1}$ is a first column vector of $C_k = [c_k, \ldots, c_{k-N+1}]$, $c_{k-1} = 0_{2 \times 1}$ and k-i<0 are assumed, and initial values are set to be $K_0 = 0_{N \times 2}$, $G_0^N = 0_{(N+1) \times 2}$, $A_0^M = 0_{M \times 1}$, $S_{M,0} = 1/\epsilon_0$, $D_0^M = 0_{M \times 1}$, $\hat{x}_{0|0} = x^v{}_0 = 0_{N \times 1}$, here, $0_{m \times n}$ denotes an m×n zero matrix)

$$-\varrho \hat{\Xi}_i + \rho \gamma_f^2 > 0, i = 0, \ldots, k \tag{45}$$

wherein, $\varrho$, $\hat{\Xi}_i$ are respectively defined by following expressions:

$$\varrho = 1 - \gamma_f^2, \hat{\Xi}_i = \frac{\rho H_i K_{s,i}}{1 - H_i K_{s,i}} = \frac{\rho H_i K_i(:,1)}{1 - (1 - \gamma_f^{-2}) H_i K_i(:,1)} \tag{46}$$

where, for the communication system or the sound system,
$x_k$ is defined as an unknown estimated state vector a state,
$x_0$ is defined as an unknown initial state,
$w_k$ is defined as an unknown system noise,
$v_k$ is defined as an observation noise,
$y_k$ is defined as an observation signal and a known input of the filter,
$z_k$ is defined as an unknown output signal,
$G_k$ is defined as a drive matrix and becomes known at execution,
$H_k$ is defined as a known observation matrix,
$\hat{x}_{k|k}$ is defined as an estimated value of the state $x_k$ at a time k using observation signals $y_0$–$y_k$ and is given by a filter equation,
$K_{s,k}$ is defined as a filter gain and is obtained from a gain matrix $K_k$,
$\rho$ is defined as a forgetting factor and, when $\gamma_f$ is determined, is automatically determined by $\rho = 1 - \chi(\gamma_f)$,
$\Sigma_0^{-1}$ is defined as a known inverse matrix of a weighting matrix expressing uncertainty of a state,
N is defined as a predetermined dimension (tap number) of a state vector,
M is defined as a predetermined order of an AR model
$\mu_k$ is defined as N+1th row vector of $K_k^{U^N}$; obtained from $K_k^{U^N}$,
$m_k$ is defined as N×2 matrix including a first to an N-th row of $K_k^{U^N}$; obtained from $K_k^{U^N}$,
$\gamma_f$ is defined as an attenuation level and is given at design time,
$D_k^M$ is defined as a backward prediction coefficient vector and is obtained from $m_k$, $\eta_{M,k}$ and $\mu_k$,
W is defined as a weighting matrix and is determined from $\gamma_f$,
$A_k^M$ is defined as a forward prediction coefficient vector and is obtained from $K_{k-1}$ and $e_{M,k}$,
$C_k^M$ is defined as a 2×M matrix including a 1st to an M-th column vector of $C_k$ and is determined from the observation matrix $H_k$,
$C_k^M$ is defined as a 2×M matrix including an N−M+1-th to an N-th column vector of $C_k$ and is determined from the observation matrix $H_k$,
$K_k^{U^N}$ is defined as the auxiliary gain matrix, and
$\eta_{M,k}$ is defined as a backward prediction error;
the instructions further comprising
by using said filter, performing for said communication system or sound system real-time identification of the time-invariant or time-variant system based on said input signal, to control the quality of the communication or sound system.

14. A system identification program product for a communication system or a sound system, the product comprising a computer usable medium having a computer readable program code embodied therein, said computer readable program code adapted to be executed to implement a method comprising providing real-time characteristics of signal or sound as an input signal for a filter;

providing a filter for performing real-time identification of a time invariable or time variable system, the filter being robust against a disturbance by determining that a maximum energy gain to a filter error from the disturbance, as an evaluation criterion, is restricted to be smaller than a upper limit $\gamma_f^2$, wherein the filter satisfies an $H_\infty$ evaluation criterion as indicated by following expression (14) with respect to a state space model as indicated by following expressions (11) to (13), when an input signal is expressed by an M($\leq$N)-th order autoregressive model (AR model), the filter is given by following expressions (38) to (44), and the filter satisfies a scalar existence condition of following expressions (45) and (46):

$$x_{k+1} = x_k + G_k w_k, \; w_k, x_k \in \mathcal{R}^N \tag{11}$$

$$y_k = H_k x_k + v_k, \; y_k, v_k \in \mathcal{R} \tag{12}$$

$$z_k = H_k x_k, \; z_k \in \mathcal{R}, \; H_k \in \mathcal{R}^{1 \times N} \tag{13}$$

$$\sup_{x_0, \{w_i\}, \{v_i\}} \frac{\sum_{i=0}^{k} \|e_{f,i}\|^2 / \rho}{\|x_0 - \check{x}_0\|_{\Sigma_0^{-1}}^2 + \sum_{i=0}^{k} \|w_i\|^2 + \sum_{i=0}^{k} \|v_i\|^2 / \rho} < \gamma_f^2 \tag{14}$$

$$\hat{x}_{k|k} = \hat{x}_{k-1|k-1} + K_{s,k}(y_k - H_k \hat{x}_{k-1|k-1}) \tag{38}$$

$$K_{s,k} = \frac{K_k(:,1)}{1 + \gamma_f^{-2} H_k K_k(:,1)} \in \mathcal{R}^{N \times 1}$$

$$K_k = m_k - D_k \mu_k, \; D_k = \begin{bmatrix} 0_{N-M} \\ D_k^M \end{bmatrix} \tag{39}$$

$$D_k^M = \frac{D_{k-1}^M - m_k(N-M+1:N,:) W \eta_{M,k}}{1 - \mu_k W \eta_{M,k}}$$

$$\eta_{M,k} = c_{k-N} + \underline{C}_k^M D_{k-1}^M \tag{40}$$

$$\begin{bmatrix} m_k \\ \mu_k \end{bmatrix} = \widetilde{K}_k^N, \; m_k \in \mathcal{R}^{N \times 2}, \; \mu_k \in \mathcal{R}^{1 \times 2} \tag{41}$$

$$\widetilde{K}_k^N = \begin{bmatrix} 0_{(N-M+1) \times 2} \\ \widetilde{K}_{k-N+M-1}^{M-1} \end{bmatrix} + G_k^N, \; \widetilde{K}_{k-N+M-1}^{M-1} = K_{k-N+M-1}(1:M,:) \tag{42}$$

$$S_{M,k} = \rho S_{M,k-1} + e_{M,k}^T W \tilde{e}_{M,k}, \; e_{M,k} = c_k + C_{k-1}^M A_k^M$$

$$A_k^M = A_{k-1}^M - K_{k-1}(1:M,:) W \tilde{e}_{M,k}, \; \tilde{e}_{M,k} = c_k + C_{k-1}^M A_{k-1}^M \tag{43}$$

where, $G_k^N$ is updated as follows:

$$\begin{bmatrix} G_k^N \\ 0_{1 \times 2} \end{bmatrix} = \begin{bmatrix} 0_{1 \times 2} \\ G_{k-1}^N \end{bmatrix} + \tag{44}$$

$$\begin{bmatrix} e_{M,k}^T / S_{M,k} \\ A_k^M e_{M,k}^T / S_{M,k} \\ 0_{(N-M+1) \times 2} \end{bmatrix} - \begin{bmatrix} 0_{(N-M+1) \times 2} \\ e_{M,k-N+M-1}^T / S_{M,k-N+M-1} \\ A_{k-N+M-1}^M e_{M,k-N+M-1}^T / S_{M,k-N+M-1} \end{bmatrix}$$

where, $$\underline{C}_k^M = C_k(:, N-M+1:N),$$

$$C_{k-1}^M = C_{k-1}(:, 1:M), \; C_k = \begin{bmatrix} H_k \\ H_k \end{bmatrix},$$

$$W = \begin{bmatrix} 1 & 0 \\ 0 & -\gamma_f^{-2} \end{bmatrix}$$

$e_{f,i} = z_{i|i}^\nu - H_i x_i$, $z_{i|i}^\nu = H_i \hat{x}_{i|i}^\nu$ ($C_k \in R^{2 \times 1}$ is a first column vector of $C_k = [c_k, \ldots, C_{k-N+1}]$, $c_{k-1} = 0_{2 \times 1}$ and k–i<0 are assumed, and initial values are set to be $K_0 = 0_{N \times 2}$, $G_0^N = 0_{(N+1) \times 2}$, $A_0^M = 0_{M \times 1}$, $S_{M,0} = 1/\epsilon_0$, $D_0^M = 0_{M \times 1}$, $\hat{x}_{0|0}^\nu = \hat{x}^\nu 0 = 0_{N \times 1}$, here, $0_{m \times n}$ denotes an m×n zero matrix)

$$-\varrho \hat{\Xi}_i + \rho \gamma_f^2 > 0, \; i = 0, \ldots, k \tag{45}$$

where, $\varrho$, $\hat{\Xi}_i$ are respectively defined by following expressions:

$$\varrho = 1 - \gamma_f^2, \; \hat{\Xi}_i = \frac{\rho H_i K_{s,i}}{1 - H_i K_{s,i}} = \frac{\rho H_i K_i(:,1)}{1 - (1 - \gamma_f^{-2}) H_i K_i(:,1)} \tag{46}$$

where, for the communication system or the sound system, $x_k$ is defined as an unknown estimated state vector a state, $x_0$ is defined as an unknown initial state, $w_k$ is defined as an unknown system noise, $v_k$ is defined as an observation noise, $y_k$ is defined as an observation signal and a known input of the filter, $z_k$ is defined as an unknown output signal, $G_k$ is defined as a drive matrix and becomes known at execution, $H_k$ is defined as a known observation matrix, $\hat{x}_{k|k}$ is defined as an estimated value of the state $x_k$ at a time k using observation signals $y_0$–$y_k$ and is given by a filter equation, $K_{s,k}$ is defined as a filter gain and is obtained from a gain matrix $K_k$, $\rho$ is defined as a forgetting factor and in a case of Theorem 1-Theorem 3, when $\gamma_f$ is determined, it is automatically determined by $\rho = 1 - \chi(\gamma_f)$, $\Sigma_0^{-1}$ is defined as a known inverse matrix of a weighting matrix expressing uncertainty of a state, N is defined as a predetermined dimension (tap number) of a state vector, M is defined as a predetermined order of an AR model $\mu_k$ is defined as N+1th row vector of $K_k^{UN}$; obtained from $K_k^{UN}$, $m_k$ is defined as N×2 matrix including a first to an N-th row of $K_k^{UN}$; obtained from $K_k^{UN}$, $\gamma_f$ is defined as an attenuation level and is given at design time, $D_k^M$ is defined as a backward prediction coefficient vector and is obtained from $m_k$, $\eta_{M,k}$ and $\mu_k$, W is defined as a weighting matrix and is determined from $\gamma_f$, $A_k^M$ is defined as a forward prediction coefficient vector and is obtained from $K_{k-1}$ and $e_{M,k}$, $C_k^M$ is defined as a 2×M matrix including a 1st to an M-th column vector of $C_k$ and is determined from the observation matrix $H_k$, $C_k^M$ is defined as a 2×M matrix including an N−M+1-th to an N-th column vector of $C_k$ and is determined from the observation matrix $H_k$, the method further comprising
by using said filter, performing for the communication system or the sound system real-time identification of the time-invariant or time-variant system based on said input signal to control the quality of the communication or sound system.

* * * * *